US 8,242,806 B1

(12) United States Patent
Cashman et al.

(10) Patent No.: US 8,242,806 B1
(45) Date of Patent: Aug. 14, 2012

(54) METHODS AND SYSTEMS FOR MANAGING A WRITE OPERATION

(75) Inventors: David Cashman, Toronto (CA); David Lewis, Toronto (CA); Lu Zhou, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/829,206

(22) Filed: Jul. 1, 2010

(51) Int. Cl.
G06F 7/38 (2006.01)

(52) U.S. Cl. ............... 326/40; 326/37; 326/38; 326/46; 326/47; 326/105; 365/189.02; 365/189.05; 365/189.08; 365/194; 365/230.06

(58) Field of Classification Search .............. 326/37–41, 326/46–47, 105; 365/189.02, 189.05, 189.08, 365/194, 230.02, 230.03, 230.06, 230.12
See application file for complete search history.

(56) References Cited

U.S. PATENT DOCUMENTS

| | | | | |
|---|---|---|---|---|
| 6,208,163 B1* | 3/2001 | Wittig et al. | | 326/39 |
| 6,288,568 B1* | 9/2001 | Bauer et al. | | 326/39 |
| 7,084,665 B1* | 8/2006 | Lewis et al. | | 326/38 |
| 7,193,433 B1* | 3/2007 | Young | | 326/38 |
| 7,304,499 B1 | 12/2007 | Lewis et al. | | |
| 7,391,236 B2* | 6/2008 | Lewis et al. | | 326/40 |
| 7,656,191 B2* | 2/2010 | Lewis et al. | | 326/40 |
| 2007/0146178 A1* | 6/2007 | Lewis et al. | | 341/106 |
| 2008/0231316 A1* | 9/2008 | Lewis et al. | | 326/40 |

OTHER PUBLICATIONS

U.S. Appl. No. 12/646,728, filed Dec. 23, 2009, by Lewis et al., entitled Distributed Memory in Field-Programmable Gate Array Integrated Circuit Devices.

* cited by examiner

Primary Examiner — Jason M Crawford
(74) Attorney, Agent, or Firm — Weaver Austin Villeneuve and Sampson LLP

(57) ABSTRACT

Systems and methods for managing a write operation are described. The systems include a logic element (LE) including an N-input look-up table (LUT) having a configurable random access memory (CRAM) including $2^N$ memory cells. The systems further include a write address decoder coupled to the LE and a write address hard logic register that stores an address of one of the memory cells. N is an integer. The hard logic register removes a dependency of a timing relationship between a write address launch and a write to the CRAM on a design of an integrated circuit.

27 Claims, 18 Drawing Sheets

METHODS AND SYSTEMS FOR MANAGING A WRITE OPERATION

FIELD OF THE INVENTION

The present disclosure generally relates to integrated circuits and other devices of that general type. More particularly, the present disclosure relates to methods and systems for managing a write operation within an integrated circuit, such as a programmable logic device (PLD) or an application specific integrated circuit (ASIC).

BACKGROUND

A programmable logic device (PLD) includes memory circuitry that can be used as random access memory (RAM). More particularly, the PLD includes a plurality of look-up tables (LUTs) that are not needed for normal LUT-based logic and such LUTs are used to provide the above-mentioned user-accessible RAM. Such RAM is "distributed RAM" because, rather than being in a block of dedicated user RAM circuitry, it is distributed over the LUTs on the PLD.

A write address register stores write addresses of a location of a memory cell of the RAM. It is difficult to configure the write address register in such a manner to be able to quickly and consistently write data to the memory cell, especially when data is read from the memory cell during the same clock cycle in which the write is performed.

SUMMARY OF THE INVENTION

Systems and methods for managing a write operation are described. The systems include a logic element (LE) including an N-input look-up table (LUT) having a configurable random access memory (CRAM) including $2^N$ memory cells. The systems further include a write address decoder coupled to the LE and a write address hard logic register configured to store an address of one of the memory cells. The hard logic register removes a dependency of a timing relationship between a write address launch and a write to the CRAM on a design of an integrated circuit. The timing relationship varies with the design and so a write operation to the RAM cannot begin at a fixed time after a rising edge of a clock signal. The implementation of the hard logic register provides certainty in that the write operation can start after the fixed time independent of a design of the integrated circuit.

BRIEF DESCRIPTION OF THE DRAWINGS

The systems and techniques may best be understood by reference to the following description taken in conjunction with the accompanying drawings, which illustrate specific embodiments of the present invention.

DETAILED DESCRIPTION

Figure 1:
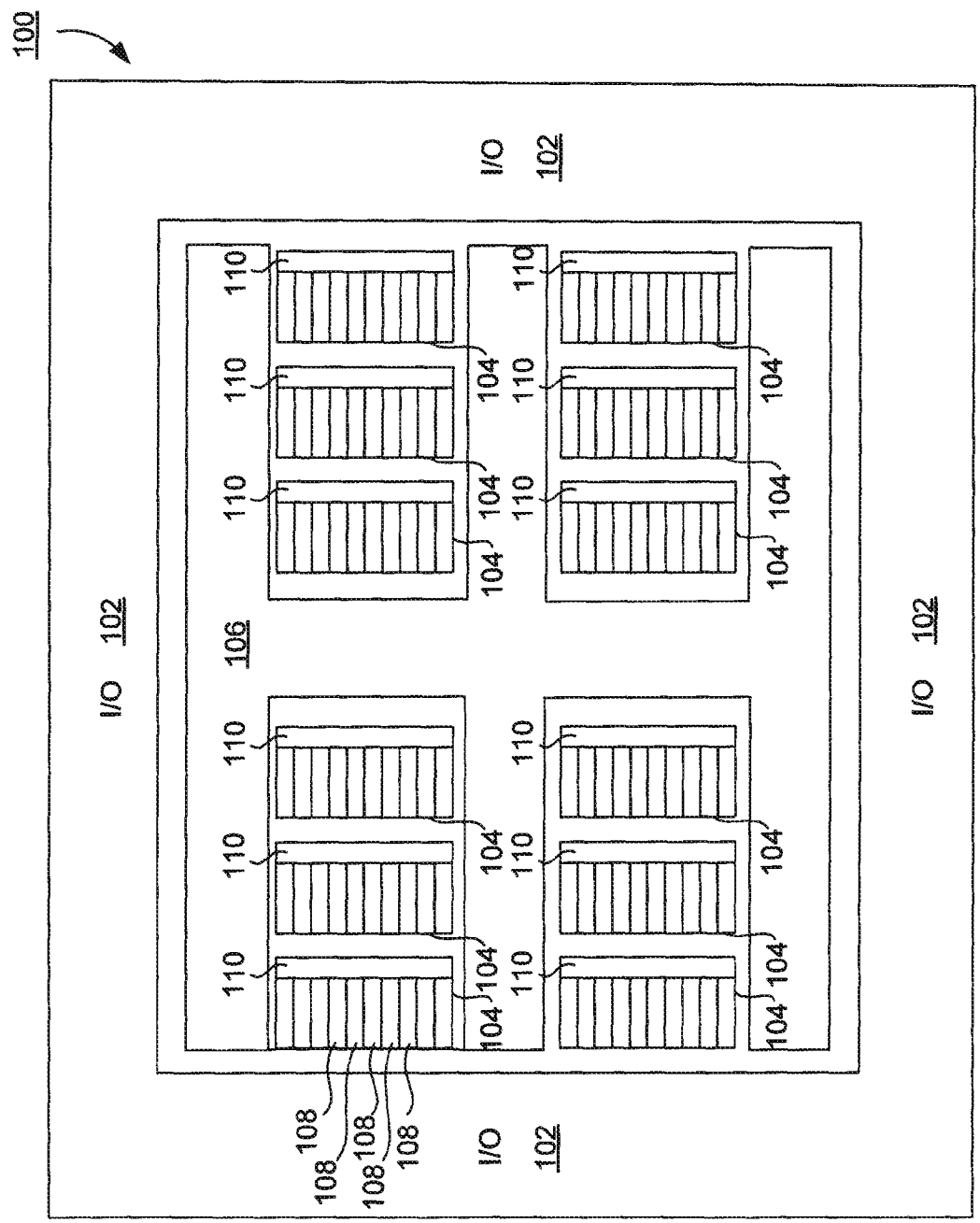
FIG. 1 is a block diagram of an embodiment of a programmable logic device (PLD).

FIG. 1 is a block diagram of an embodiment of a programmable logic device (PLD) 100, such as a field programmable gate array (FPGA). Examples of PLD 100 include each of Stratix II™, Stratix III™, Stratix IV™, and Stratix V™ FPGAs manufactured by Altera™ Corporation of San Jose, Calif. PLD 100 includes a plurality of input/output (I/O) devices 102 and a plurality of logic array blocks (LABs) 104 connected to the I/O devices 102. One LAB 104 is connected to another LAB 104 via programmable routing and one or more LAB lines 106.

Each LAB 104 includes a plurality of logic elements (LEs) 108, which can be implemented as memory or logic. According to various embodiments, each LE is implemented as an Adaptive Logic Module (ALM). Each ALM can be flexibly configured to include one or more lookup tables (LUTs). LEs 108 are connected via a plurality of local lines 110.

Figure 2:
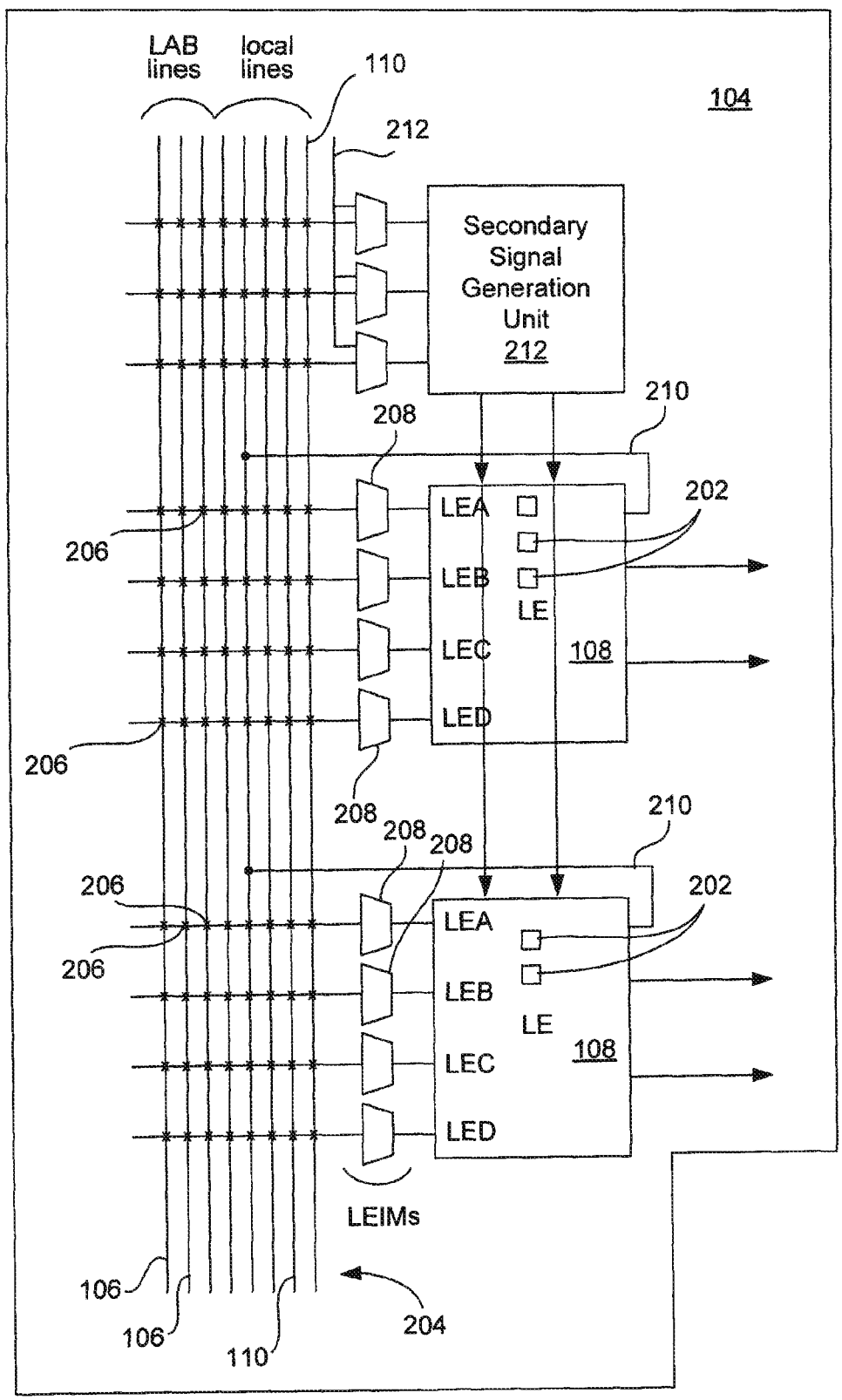
FIG. 2 is a block diagram of a logic array block (LAB) of the PLD of FIG. 1.

FIG. 2 is a block diagram of LAB 104 (FIG. 1). LAB 104 includes LEs 108 (FIG. 1). Although only two LEs 108 are shown in FIG. 2, LAB 104 may include any number of LEs 108. Each LE 108 generates one or more combinatorial functions of N select inputs, where N is an integer greater than zero. For example, N ranges from three to six. Each LE 108 includes an edge-triggered flip-flop or a level-sensitive latch, both of which are described below. A combinatorial function is implemented to execute non-RAM logic by using $2^N$ bits of $2^N$ configuration cells 202 of configuration RAM (CRAM) and building a multiplexer (MUX) tree including one or more multiplexers to select from the bits by using the N select inputs. Alternatively, LE 108 is configured to implement RAM logic by storing $2^N$ bits within $2^N$ memory cells 202, which are same as the $2^N$ configuration cells 202.

Moreover, LAB 104 includes an interconnect matrix 204 including a number of LAB lines 106, a plurality of input connections 206, one or more of which are selected by any of a plurality of LE input multiplexers (LEIMs) 208 of LAB 104. For example, based on a select bit within a configuration cell (not shown) connected to a select input of LEIM 208, LEIM 208 selects input connection 206 or another input connection 206 to provide an input signal to LE 108. Local lines 110 are part of interconnect matrix 204. Moreover, a feedback line 210 feeds back an output of LE 108 to an input of the LE 108.

Each LAB 104 includes a secondary signal generation unit 212 that routes one or more secondary signals, such as synchronous clear, asynchronous clear, synchronous load, asynchronous load, clock enable, and clock signals, from one or more of LAB lines 106, one or more or local lines 110, or a combination of the LAB and local lines 106 and 110 to LEs 108. A clock signal, described below, may be a global signal received via a global signal line 212, which is a part of interconnect matrix 204. Another example of a global signal includes a clock enable signal. Secondary signal generation unit 212 includes a plurality of logic devices that select and condition the secondary signals to provide the selected and conditioned signals to LEs 108.

Figure 3:
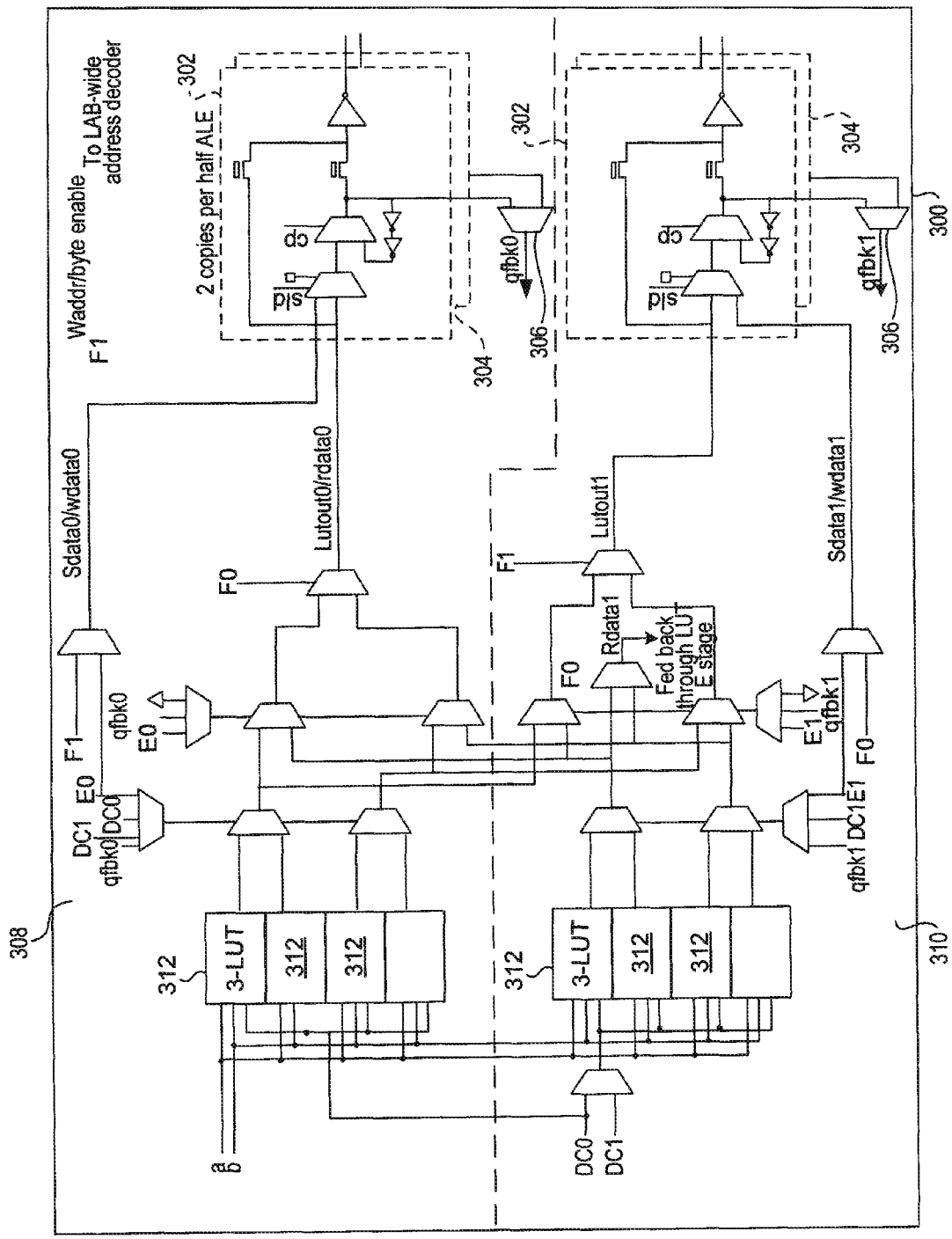
FIG. 3 is a block diagram of an embodiment of an adaptive logic module (ALM) that is implemented within the LAB of FIG. 2.

FIG. 3 is a block diagram of an embodiment of an ALM 300 that includes a plurality of write data registers 302, a plurality of read data registers 304, and a plurality of feedback multiplexers 306. ALM 300 may be implemented within the Stratix V™ FPGA. ALM 300 is an example of LE 108 (FIG. 2). ALM 300 includes a top-half portion 308 and a bottom-half portion 310. Top-half portion 308 includes write data register 302 and read data register 304 and bottom-half portion 310 includes write data register 302 and read data register 304. Each register 302 and 304 may a time-borrowing, level-sensitive latch, or edge-triggered flip-flop.

Although a plurality of 3-LUTs 312 is shown in FIG. 3, ALM 300 includes any number of N select input LUTs 312. Each half-portion 308 or 310 acts as a RAM slice, such as a CRAM that includes $2^N$ memory cells 202 (FIG. 2).

In another embodiment, ALM 300 does not include feedback multiplexers 306.

Figure 4:
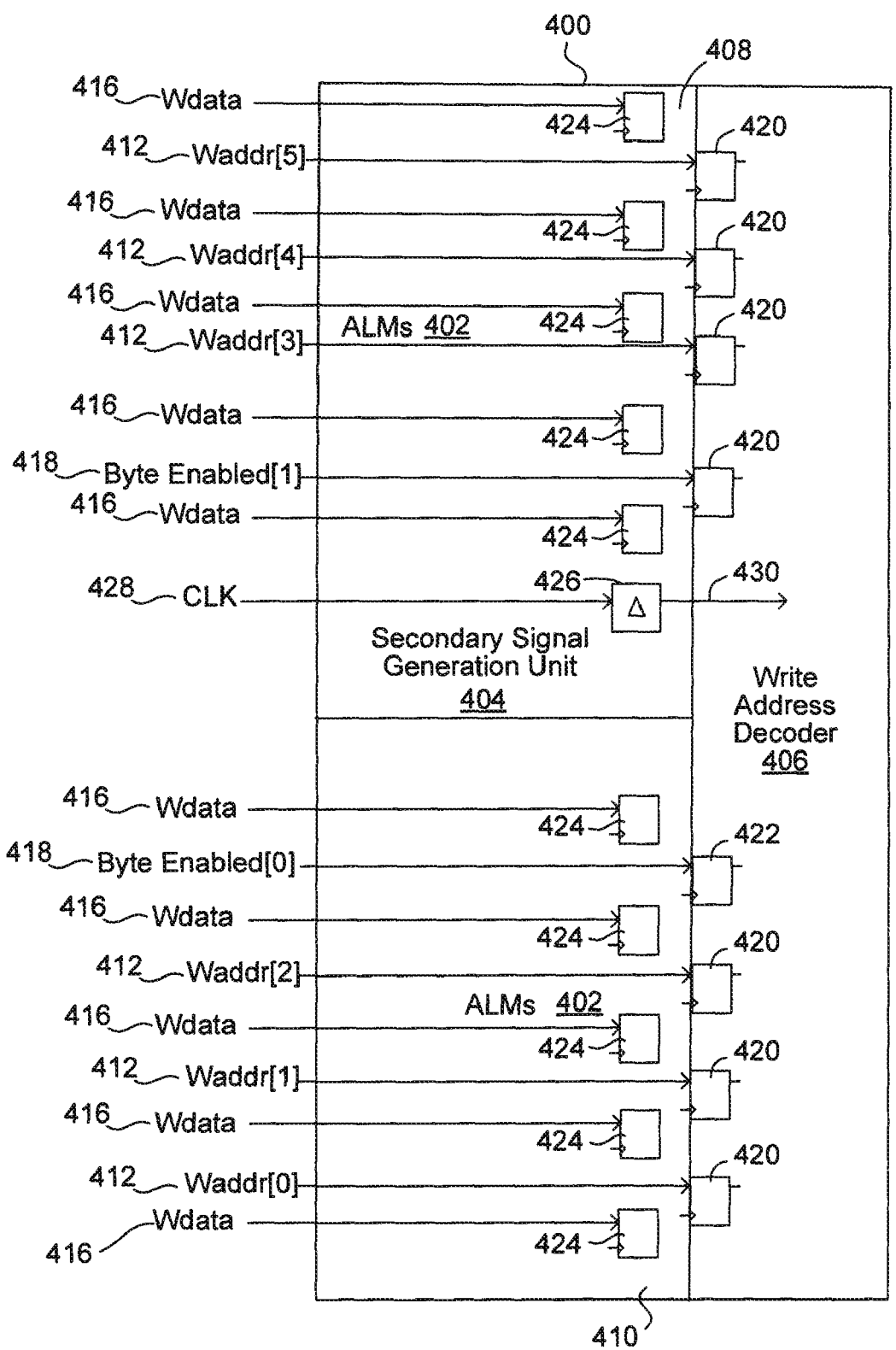
FIG. 4 is a block diagram of another embodiment of a LAB.

FIG. 4 is a block diagram of an embodiment of a LAB 400, which is an example of LAB 104 (FIG. 2). LAB 400 includes a plurality of ALMs 402, another plurality of ALMs 402, a secondary signal generation unit 404, and a write address decoder 406. Secondary signal generation unit 404 is an example of secondary signal generation unit 212 (FIG. 2). ALM 300 (FIG. 3) is an example of any of ALMs 402.

LAB 400 includes any number M ALMs 402, such as 10 or 20 ALMs 402, with half of the ALMs 402 located in a top portion 408 of LAB 400 and the remaining half of the ALMs 402 located in bottom portion 410 of LAB 400.

Write address decoder 406 decodes write addresses of all ALMs 402 of LAB 400. Each ALM 402 includes a $2^N \times M$ RAM slice. For example, if N is equal to six, M is equal to 1, and if N is equal to five, M is equal to two. For supporting a $2^N \times M$ RAM slice, each ALM 402 receives N read address signals and M write data signals, leaving one LEIM 208 (FIG. 2) for write address signal 412 or a byte-enable signal 418. Write address signals 412 are distributed across all ALMs 402 of LAB 400. An assertion of byte-enable signal 418 enables a write to ALMs 402 within a portion, such as top portion 408 or bottom portion 410, of LAB 400, that receives the byte-enable signal 418.

ALMs 402 include a plurality of write address registers 420, a plurality of byte-enable registers 422, and a plurality of write data registers 424. Write data register 302 (FIG. 3) is an example of write data register 424. Write address registers 420 and byte-enable registers 422 are divided equally between the top and bottom portions 408 and 410 of LAB 400. Each byte-enable register 422 within a portion, such as top portion 408 or bottom portion 410, of LAB 400, stores a bit that indicates whether a write to a CRAM of the ALMs 402 within that portion is enabled. Write data registers 424, write address registers 420, and byte-enable registers 422 include dedicated logic that provides a plurality of input signals to write address decoder 406. A register that is dedicated is implemented in hard logic. A register that is not dedicated is implemented in soft logic.

Write data register 424 includes dedicated logic that is not used for a function other than storing data to be written to memory cell 202 (FIG. 2). For example, write data register 424 does not include logic that is used for storing data read from memory cell 202 (FIG. 2). Write address register 420 includes dedicated logic that is not used for a function other than storing an address of memory cell 202 (FIG. 2) to be written to. For example, write address register 420 does not include logic that is used for storing data read from or to be written to memory cell 202 (FIG. 2). Byte-enable register 422 includes dedicated logic that is not used for a function other than storing data that indicates whether a write to memory cell 202 (FIG. 2) within top portion 408 or bottom portion 410 of LAB 400 is enabled for executing a write operation to the memory cell 202.

LAB 400 includes a delay circuit 426 that adds a delay to a clock signal 428. Clock signal 428 is an undelayed clock signal. Clock signal 428 is generated by a clock source (not shown), such as a crystal oscillator or a crystal oscillator connected to a phase lock loop (PLL) (not shown). The delay is added to generate a delayed clock signal 430. Delayed clock signal 430 is provided to all registers, such as write address registers 420, write data registers 424, and byte-enable registers 422, of LAB 400. Clock signal 428, write data signals 416, byte-enable signals 418, and write address signals 412 are received via any portion of interconnect matrix 204 (FIG. 2).

It is noted that although write address registers 420 and byte-enable registers 422 are shown within write address decoder 406, in an alternative embodiment, the write address registers 420 and byte-enable registers 422 are located outside write address decoder 406.

Figure 5:
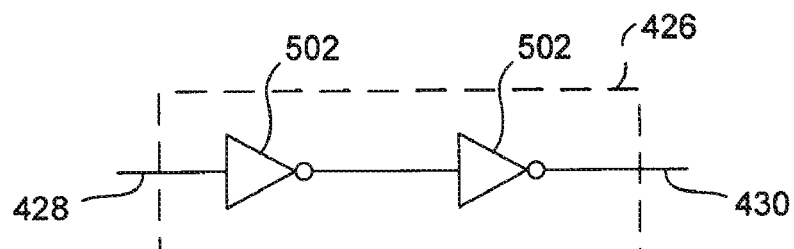
FIG. 5 is a circuit diagram of an embodiment of a delay circuit used within the LAB of FIG. 4.
Figure 6:
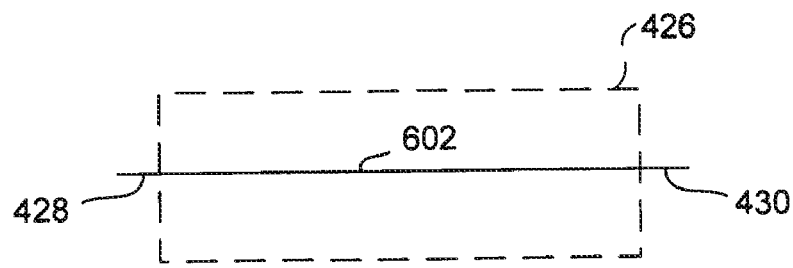
FIG. 6 is a circuit diagram of an alternative embodiment of the delay circuit.
Figure 7:
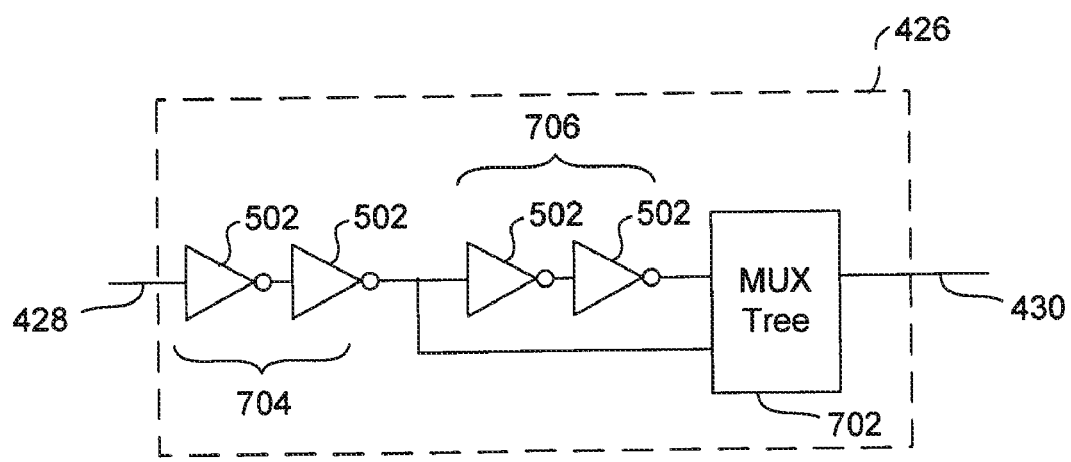
FIG. 7 is a circuit diagram of another alternative embodiment of the delay circuit.

FIG. 5 is a circuit diagram of an embodiment of delay circuit 426 (FIG. 4). Delay circuit 426 includes a series of NOT gates 502. FIG. 6 is a circuit diagram of an alternative embodiment of delay circuit 426 (FIG. 4). Delay circuit 426 includes a conductor 602, such as a wire. FIG. 7 is another alternative embodiment of delay circuit 426 (FIG. 4). Delay circuit 426 includes a series of NOT gates 502 connected to a multiplexer tree 702 that includes one or more multiplexers to select either a signal output from a first set 704 of NOT gates 502 or a signal output from a second set 706 of NOT gates 502 to provide different amount of delays to delayed clock signal 430. In an alternative embodiment, delay circuit 426 (FIG. 4) includes any even number of NOT gates 502.

Figure 8:
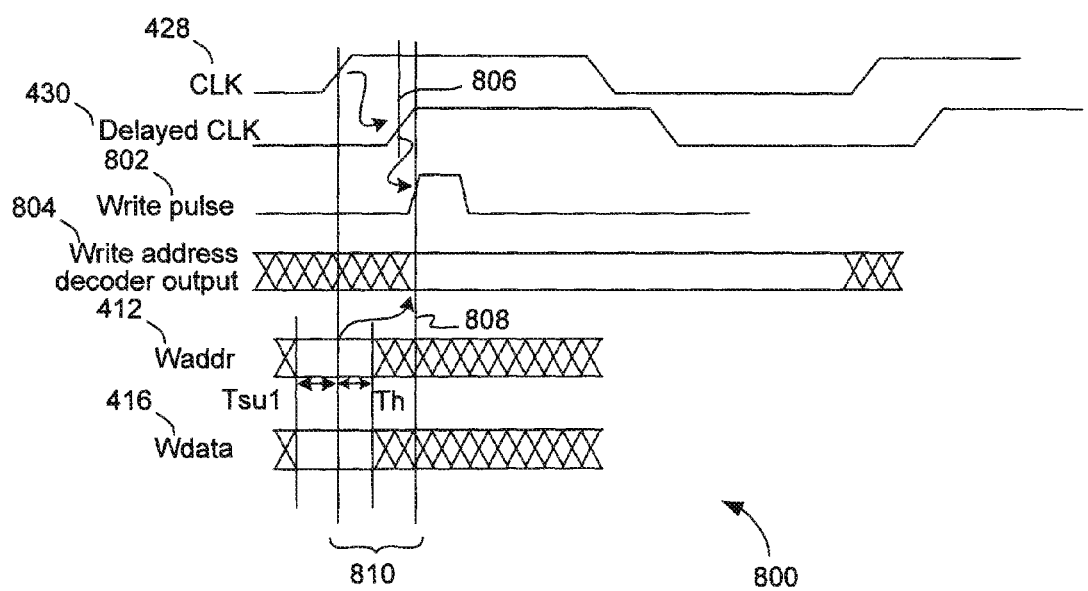
FIG. 8 is a timing diagram of an embodiment of a method of operation of a portion of the LAB of FIG. 4.

FIG. 8 is a timing diagram 800 of an embodiment of a method of operation of a portion of LAB 400 (FIG. 4). Timing diagram 800 includes clock signal 428, delayed clock signal 430, a write pulse 802, a write address decoder output signal 804, write address signal 412, and write data signal 416. Write address decoder output signal 804 is a signal output by write address decoder 406 (FIG. 4). Write pulse 802 indicates whether a write operation is performed to an address, of memory cell 202 (FIG. 2) of ALM 402 (FIG. 4), that is decoded by write address decoder 406 to output write address decoder output signal 804. Write pulse 802 is received via a dedicated conductor, such as one of local lines 110 (FIG. 2) or a separate local line (not shown in FIG. 2), similar to one of local lines 110 (FIG. 2), from a write pulse configuration bit within a write pulse configuration cell (not shown) of LAB 104 (FIG. 2). The write pulse configuration bit is programmed by compiling a program code, such as a System on Programmable Chip Builder (SOPC Builder), described below.

Write address decoder output signal 804 includes an address, of memory cell 202 (FIG. 2), output by write address decoder 406. The 'X's in FIG. 8 of write address decoder output signal 804 indicate that the write address decoder output signal 804 is not stable, such as lacks a particular value, and lack of 'X's indicate that the write address decoder output signal 804 is stable, such as has a particular value. Write address signal 412 is a signal representing an address stored within write address register 420 (FIG. 4) and the write address register 420 provides the address to write address decoder 406 to decode. Write address decoder output signal 804 is generated based on write address signal 412. Write data signal 416 is a signal representing data stored within write data register 424 and the data is to be written to memory cell 202 (FIG. 2) that has an address, within PLD 100 (FIG. 1), to which data is written.

A processor, described below, receives via an input device, also described below, inputs to the program code from a user. The processor may be implemented within an FPGA or an Application Specific Integrated Circuit (ASIC). The write pulse configuration bit is controlled by the processor to generate write pulse 802 and the write pulse 802 is generated at a time immediately after delayed clock signal 430 is asserted. For example, there is no delay or a natural delay between an assertion of delayed clock signal 430 and an assertion of write pulse 802. Accordingly, a write operation of CRAM, of ALM 402 (FIG. 4), that includes memory cell 202 (FIG. 2) begins promptly after a rising edge 806 of delayed clock signal 430.

The user also programs, within the program code, an amount of delay to add to clock signal 428 to generate delayed clock signal 430. An amount of delay to add to clock signal 428 to generate delayed clock signal 430 is based on a time 808 at which write address decoder output signal 804 becomes stable. For example, the processor determines whether write address decoder output signal 804 is stable to output a specific address of memory cell 202 (FIG. 2) of PLD 100 (FIG. 1). Upon determining that write address decoder output signal 804 is not stable, the processor controls delay circuit 426 (FIG. 4) to not assert delayed clock signal 430 after clock signal 428 is asserted for a certain time.

At time 808 at which write address decoder output signal 804 becomes stable, the processor controls delay circuit 426 (FIG. 4) to assert delayed clock signal 430. At a time delayed clock signal 430 is asserted, write address signal 412 indicating an address of memory cell 202 (FIG. 2) is registered within write address register 420 (FIG. 4) and write data signal 416 indicating data to be written to the memory cell 202 is registered within write data register 424 (FIG. 4).

'Tsu1', shown in FIG. 8, indicates a set-up time period from receiving data within write data register 424 and receiving an address within write address register 420. 'Th', shown in FIG. 8, indicates a hold time period for holding an address within write address register 420 and holding data, within write data register 424, to be written to memory cell 202 (FIG. 2) having the address after clock signal 428 is asserted.

Before a write operation to write data to memory cell 202 (FIG. 2) of ALM 402 (FIG. 4) having an address output by write address decoder 406 begins, a sufficient amount of time, such as a time period 810, is provided to allow write data registers 424 to register data received at a data input of the write data registers 424, to allow write address register 420 to register data received at a data input of the write address register 420, to allow byte-enable register 422 to register data received at a data input of the byte-enable register 422, and for the address output by write address register 420 to propagate through write address decoder 406. This sufficient amount of time is equivalent to, such as equal to or slightly greater than, the delay of delayed clock signal 430. The sufficient amount of time is slightly greater than the delay of delayed clock signal 430 to allow a natural amount of time for write pulse 802 to assert immediately after delayed clock signal 430 is asserted.

The dedicated logic of write address register 420 (FIG. 4), write data register 424 (FIG. 4), and byte-enable register 422 (FIG. 4) enables the processor to determine the delay to add to clock signal 428 regardless of whether PLD 100 is a Stratix II, Stratix III, Stratix IV, or Stratix V FPGA. As an example, the processor determines the delay to be a small amount, such as a fraction of a cycle of clock signal 428, so that a majority of a cycle of delayed clock signal 430 is available for a write operation to memory cell 202 (FIG. 2) to complete and for data to propagate from a CRAM of ALM 402 (FIG. 4) to read data register 304 (FIG. 3) of the ALM if a read address and a write address has the same value of an address of the memory cell 202 (FIG. 2) A write operation ends at a time write pulse 802 is deasserted. The write pulse 802 can be deasserted by the processor by deasserting the write pulse configuration bit or by a timer (not shown) within PLD 100.

In an alternative embodiment, all registers 420, 422, and 424, shown in FIG. 4 are negative edge-triggered rather than positive edge-triggered as shown in FIG. 8.

In another alternative embodiment, an amount of delay to add to clock signal 428 is not programmable by using the program code and is generated based on delay circuit 426 selected by the user. In this alternative embodiment, the amount of delay is not field programmable.

Figure 9:
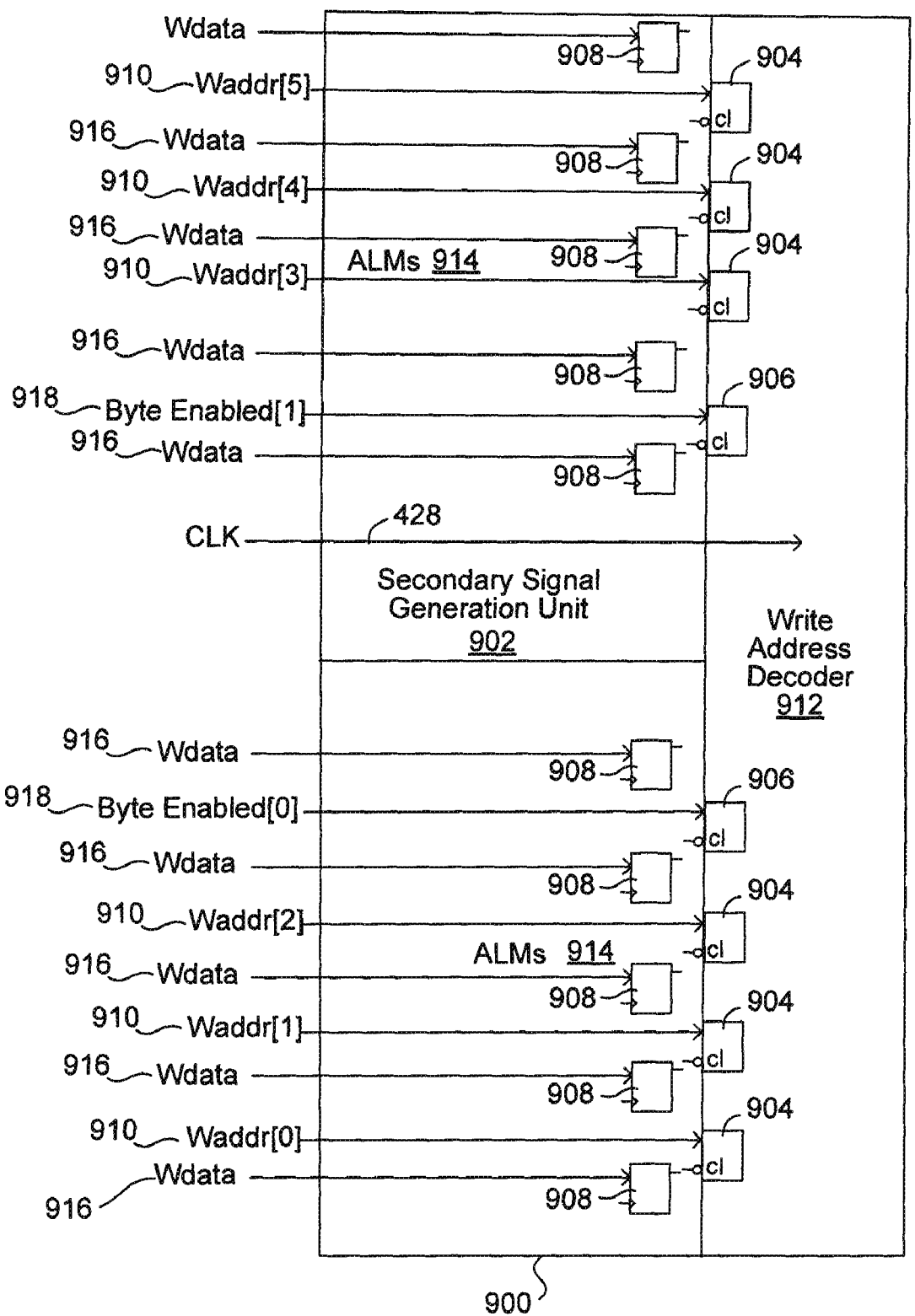
FIG. 9 is a block diagram of another embodiment of a LAB.

FIG. 9 is a block diagram of an embodiment of a LAB 900, which is another example of LAB 104 (FIG. 2). LAB 900 is similar to LAB 400 (FIG. 4) except that LAB 900 does not include delay circuit 426 (FIG. 4) in a secondary signal generation unit 902, which is an example of secondary signal generation unit 212 (FIG. 2), includes a plurality of write address registers 904, includes a plurality of byte-enable registers 906, and a plurality of write data registers 908. Write address registers 904 receive a plurality of write address signals 910 and latch the signals to output data to a write address decoder 912. Write data registers 908 are located within a plurality of ALMs 914. Write data registers 908 receive a plurality of write data signals 916 and latch the signals to output data to be stored in a CRAM of ALM 914. Byte-enable register 906 performs the same function, as described above, of enabling a write except with respect to ALMs 914 by storing a byte-enable signal 918.

All write address registers 904, byte-enable registers 906, and write data registers 908 are level-sensitive latches and are not edge-triggered registers. Any of registers 906, 906, and 908 stores and outputs data received at its data input at a time clock signal 428 (FIG. 8) is low, such as not asserted. Write address registers 904, write data registers 908, and byte-enable registers 906 are dedicated as described above.

In an alternative embodiment, write data registers 908 are edge-triggered registers. In another alternative embodiment, any of registers 904, 906, and 908 stores and outputs data received at its data input at a time clock signal 428 (FIG. 8) is high, such as asserted. In yet another alternative embodiment, write data registers 908 are not dedicated but are built using registers, of LAB 104 (FIG. 2), that are used for performing other functions, such as reading data from memory cell 202

(FIG. 2). In still another alternative embodiment, write data registers 908 are located on a LAB, other than LAB 104, of PLD 100 (FIG. 1).

It is noted that although write address registers 904 and byte-enable registers 906 are shown within write address decoder 912, in an alternative embodiment, the write address registers 904 and byte-enable registers 906 are located outside write address decoder 912.

Figure 10:
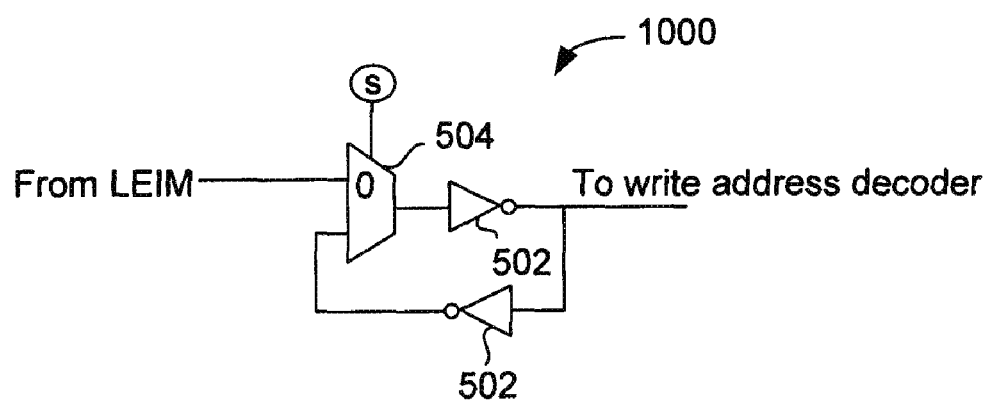
FIG. 10 is a circuit diagram of an embodiment of a level-sensitive latch used within the LAB of FIG. 9.

FIG. 10 is a circuit diagram of an embodiment of a level-sensitive latch 1000. Level-sensitive latch 1000 includes a plurality of NOT gates 502 connected to a multiplexer 504. LAB 900 (FIG. 9) consumes less area than that consumed by LAB 400 (FIG. 4). LAB 900 does not include delay circuit 426 (FIG. 4) and includes at least one of a set of write data registers 908, write address registers 904, and byte-enable registers 906 as level-sensitive latches, which consume less area than an edge-triggered register. An edge-triggered register may be built by using two level-sensitive latches, such as a master latch and a slave latch, in series.

Figure 11:
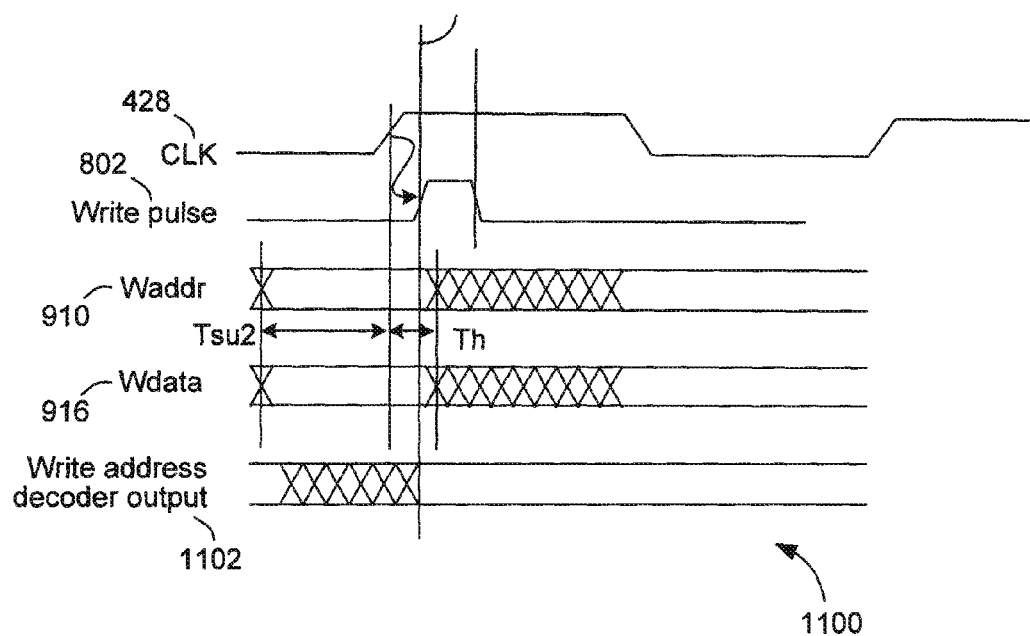
FIG. 11 is a timing diagram of an embodiment of a method of operation of a portion of the LAB of FIG. 9.

FIG. 11 is a timing diagram 1100 of an embodiment of a method of operation of a portion of LAB 900 (FIG. 9). Timing diagram 1100 includes clock signal 428, write pulse 802, a write address decoder output signal 1102, write address signal 910, and write data signal 916. Write address decoder output signal 1102 is a signal output by write address decoder 912 (FIG. 9). Write pulse 802 indicates whether a write operation is performed to an address, of memory cell 202 (FIG. 2) of ALM 914 (FIG. 9), that is decoded by write address decoder 912 to output write address decoder output signal 1102. Write pulse 802 is received via a dedicated conductor, such as one of local lines 110 (FIG. 2) or a separate local line (not shown in FIG. 2), similar to one of local lines 110 (FIG. 2), from the write pulse configuration bit of LAB 104 (FIG. 2).

Write address decoder output signal 1102 includes an address, of memory cell 202, output by write address decoder 912 (FIG. 9). The 'X's of write address decoder output signal 1102 in FIG. 11 indicate whether the write address decoder output signal 1102 is stable as explained above. Write address signal 910 is a signal representing an address stored within write address register 904 (FIG. 9) and the write address register 904 provides the address to write address decoder 912 (FIG. 9) to decode. Write address decoder output signal 1102 is generated based on write address signal 910. Write data signal 916 is a signal representing data stored within write data register 908 and the data is to be written to memory cell 202 (FIG. 2) that has an address, within PLD 100 (FIG. 1), to which data is written. An address, of memory cell 202 (FIG. 2), to which data is written is decoded by write address decoder 912 (FIG. 9).

The processor controls the write pulse configuration bit to assert write pulse 802 immediately after clock signal 428 is asserted. For example, there is no delay or a natural delay between an assertion of clock signal 428 and an assertion of write pulse 802. As a result, more time is provided by the processor for a write operation to complete, for data to be written to memory cell 202 (FIG. 2) during the write operation, and for propagation of the data to read register 304 (FIG. 3) in case of writing to and reading from the same memory cell 202 (FIG. 2) during the same cycle of clock signal 428, than that provided by the processor in case of delayed clock signal 430 (FIG. 4). This additional amount of time results in a larger set-up time (Tsu2) than the set-up time Tsu1. The larger set-up time Tsu2 can be reduced by a variety of techniques, performed by the user, such as, pipelining of a write-data register, a write address register, and a byte-enable register, and placement of the registers during a place and route phase, described below.

The processor determines the set-up time Tsu2 for latching data at a data input of byte-enable register 906 (FIG. 9) that enables a write to memory cell 202 (FIG. 2) of a $2^N \times M$ RAM slice of ALM 900 (FIG. 9), for latching an address of the memory cell 202 at a data input of write address register (FIG. 9), and for latching data at a data input of write data register 908 to be written to the memory cell 202. The processor determines the set-up time Tsu2 to be greater than the set-up time Tsu1 by a certain amount to allow for certain amount of time for the address to propagate through write address decoder 912 (FIG. 9). This certain amount of time is a fraction of a clock cycle of clock signal 428.

The user provides the certain amount of time to the processor via the input device. At a time clock signal 202 is deasserted, byte-enable register 906 and write address register 904 is transparent to enable data input at their respective data inputs to flow through. At a time write pulse 802 is asserted, write address decoder output signal 1102 is stable to output a specific address of memory cell 202 and the address was latched to write address register 904.

A write operation to memory cell 202 (FIG. 2) of PLD 100 (FIG. 1) having an address output by write address decoder 912 begins at a time write pulse 802 is asserted and ends at a time write pulse 802 is deasserted.

It is noted that in another embodiment, an extra bank, such as a pipeline, of write address, data, and byte-enable registers, is implemented in soft logic on a LAB (not shown) separate from LABs 400 and/or 900, to delay each write by one cycle to write old data to memory cell 202 (FIG. 2) before the old data is written with new data by asserting write pulse 802 (FIGS. 8 and 11).

Figure 12:
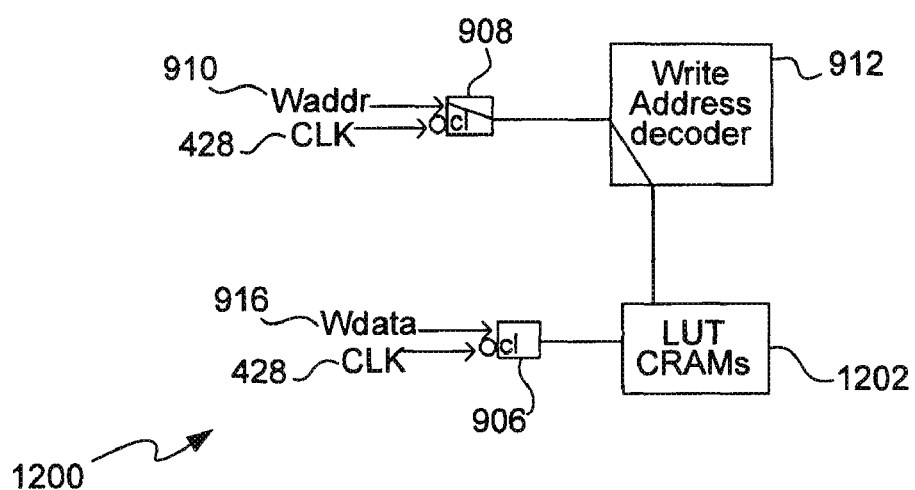
FIG. 12 is a block diagram of an embodiment of a system illustrating a reason for increasing a set-up time from Tsu1 used within the LAB of FIG. 4 to Tsu2 used within the LAB of FIG. 9.

FIG. 12 is a block diagram of an embodiment of a system 1200 illustrating a reason for increasing the set-up time from Tsu1 to Tsu2. System 1200 includes write data register 908 (FIG. 9), write address register 904 (FIG. 9), write address decoder 912 (FIG. 9), and a $2^N \times M$ RAM slice 1202 of ALM 914 (FIG. 9). A distance for write address signal 910 (FIG. 11) to travel from write address register 908 to RAM slice 1202 is greater than a distance for write data signal 916 (FIG. 11) to travel from write data register 908 to RAM slice 1202. Accordingly, in the embodiment described with respect to FIGS. 9 and 11, the set-up time Tsu2 for write data register 908 can be Tsu1, which is less than the set-up time Tsu2 for write address register 908.

In another embodiment, a distance for write address signal 910 (FIG. 11) to travel from write address register 908 to RAM slice 1202 is equivalent to, such as equal to, a distance for write data signal 916 (FIG. 11) to travel from write data register 908 to RAM slice 1202.

Figure 13:
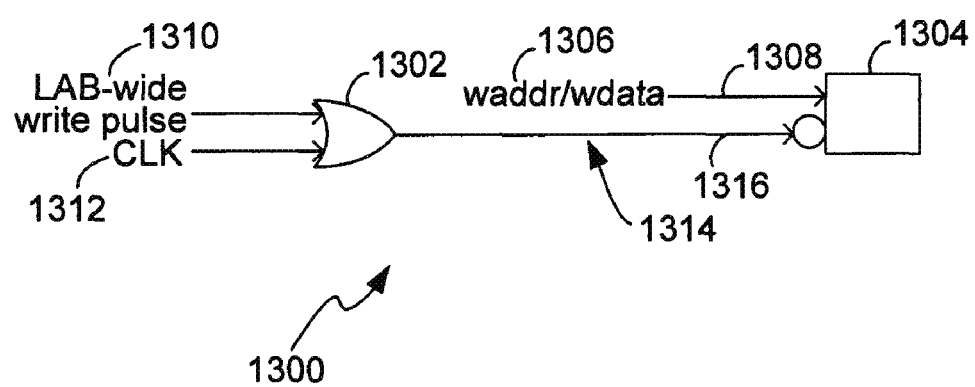
FIG. 13 is a circuit diagram of an embodiment of a system for controlling a completion of a write operation.
Figure 14:
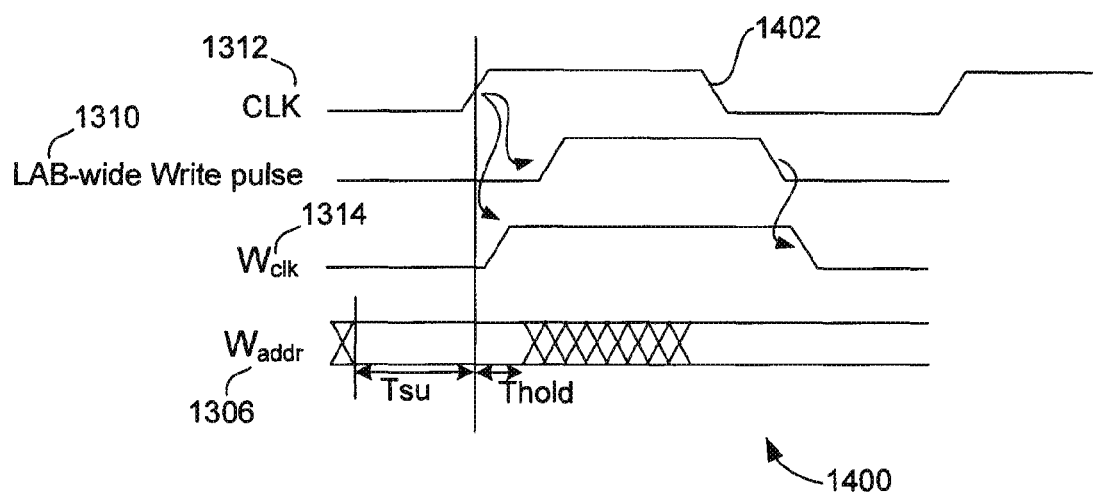
FIG. 14 is a timing diagram illustrating an embodiment of a method of operation of the system of FIG. 13.

FIG. 13 is a circuit diagram of an embodiment of a system 1300 for controlling a completion of a write operation and FIG. 14 is a timing diagram 1400 illustrating an embodiment of a method of operation of system 1300 of FIG. 13. System 1300 includes an OR gate 1302 and a register 1304. Register 1304 receives a signal 1306 at its data input 1308. OR gate 1302 receives a LAB-wide write pulse 1310 and a clock signal 1312.

Register 1304 is write data register 908 (FIG. 9) if system 1300 is implemented within LAB 900 (FIG. 9), if signal 1306 is write data signal 916 (FIG. 11), and if clock signal 1312 is clock signal 428 (FIG. 11). Register 1304 is write address register 904 (FIG. 9) if system 1300 is implemented within LAB 900 (FIG. 9), if signal 1306 is write address signal 910 (FIG. 11), and if clock signal 1312 is clock signal 428 (FIG.

11). Signal 1306 is write address signal 910 (FIG. 11) if register 1304 is write address register 904 (FIG. 9) and is write data signal 916 (FIG. 11) if register 1304 is write data register 908 (FIG. 9).

Register 1304 is write data register 424 (FIG. 4) if system 1300 is implemented within LAB 400 (FIG. 4), if signal 1306 is write data signal 416 (FIG. 4), and if clock signal 1312 is delayed clock signal 430 (FIG. 8). Register 1304 is write address register 420 (FIG. 4) if system 1300 is implemented within LAB 400 (FIG. 4), if signal 1306 is write address signal 412 (FIG. 4), and if clock signal 1312 is delayed clock signal 430 (FIG. 8). Signal 1306 is write address signal 412 (FIG. 4) if register 1304 is write address register 420 (FIG. 4) and is write data signal 416 (FIG. 4) if register 1304 is write data register 424 (FIG. 4).

Clock signal 1312 is gated, via OR gate 1302, with LAB-wide write pulse 1310. OR gate 1312 has no effect when a write operation, illustrated by FIGS. 8 and 11, to memory cell 202 (FIG. 2) of $2^N \times M$ RAM slice 1202 (FIG. 12) is complete before falling edge 1402 of clock signal 428 (FIG. 11) or delayed clock signal 430 (FIG. 8). On the other hand, if a write operation, illustrated by FIGS. 8 and 11, to memory cell 202 (FIG. 2) is not complete before falling edge 1402 of clock signal 428 (FIG. 11) or delayed clock signal 430 (FIG. 8), OR gate 1302 ORs clock signal 1312 with LAB-wide write pulse 1310, which is asserted high via a timer circuit (not shown) of PLD 100. LAB-wide write pulse 1310 is asserted high during a write operation and until the write operation completes and is asserted low upon completion of the write operation. OR gate 1302 ORs LAB-wide write pulse 1310 with clock signal 428 to output an assertion for a time period during which LAB-wide write pulse 1310 is asserted and independent of whether clock signal 428 is asserted or deasserted.

OR gate 1302 outputs a write clock signal 1314 to a clock input 1316 of register 1304. Upon receiving write clock signal 1314, as along as the write clock signal 1314 is asserted, register 1304 does not latch data at its data input 1308. Accordingly, OR gate 1302 prevents data from latching into register 1304 at a time LAB-wide write pulse 1310 is asserted.

On the other hand, when a write operation, illustrated using FIGS. 8 and 11, is complete before falling edge 1402 of clock signal 428 (FIG. 11) or delayed clock signal 430 (FIG. 8), LAB-wide write pulse 1310 is deasserted. Upon deassertion of LAB-wide write pulse 1310, write clock signal 1314 is deasserted at a time clock signal 1312 is deasserted. Upon deassertion of write clock signal 1314, register 1304 latches data at its data input 1308.

Without implementing system 1300 within PLD 100 (FIG. 9), a write operation, illustrated by FIGS. 8 and 11, has to complete before falling edge 1402 of clock signal 1312 or new data may flow into write data register 908 (FIG. 9) before the write operation completes. For a write operation to complete before falling edge 1402 of clock signal 1312, there is an implication of a minimum cycle time and duty cycle of clock signal although it is likely that the cycle time and duty cycle is high to accommodate high-speed designs of PLD 100 (FIG. 1). To avoid this issue related to the minimum cycle time and duty cycle, clock signal 1312 is gated with LAB-wide write pulse 1310 to provide an output of OR gate 1302 to register 1304. This gating ensures that register 1304 does not become transparent, such as stores data received at its data input, until completion of a write operation even if the completion occurs after falling edge 1402 of clock signal 1312.

Figure 15:
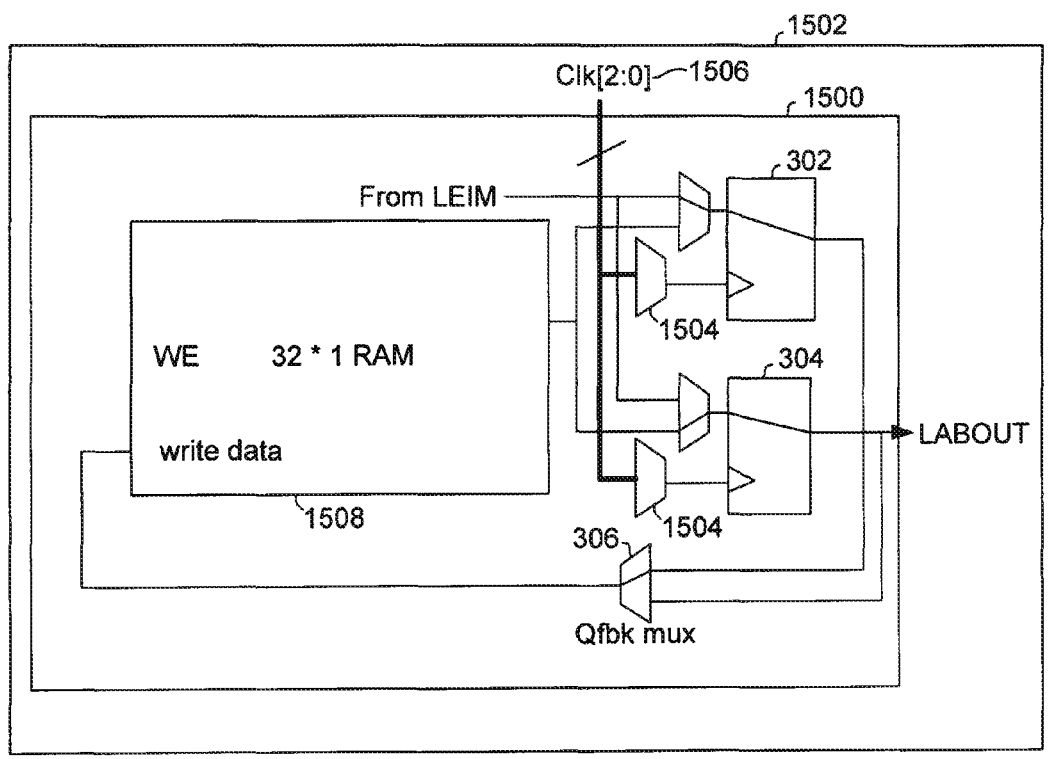
FIG. 15 is a block diagram of an embodiment of a top-half portion of an ALM.

FIG. 15 is a block diagram of an embodiment of a top-half portion 1500 of an ALM 1502. ALM 1502 is an example of any of ALMs 402 (FIG. 4) or any of ALMs 914 (FIG. 9). Top-half portion 1500 is an example of top-half portion 308 (FIG. 3). Top-half portion 1500 includes a 32×1 CRAM 1508, a plurality of multiplexers 1504, read data register 304, and write data register 302. Each of write data registers 424 (FIG. 4) and write data register 908 (FIG. 9) is an example of write data register 302. Read data register 304 may be implemented in hard logic or soft logic. If implemented in hard logic, read data register 304 is dedicated to storing data read from memory cell 202 (FIG. 2) and not used for any other purpose, such as storing data to be written to the memory cell 202. If implemented in soft logic, read data register 304 is not dedicated to storing data read from memory cell 202 (FIG. 2) and can be used for other purposes, such as, storing data to write to memory cell 202 or as a counter. Top-half portion 1500 also includes feedback multiplexer 306 (FIG. 3).

A clock signal 1506, such as clock signal 428 (FIG. 11) or delayed clock signal 430 (FIG. 8), is provided to multiplexer 1504 to read data from read data register 304 and is provided to multiplexer 1504 to write data to write data register 302. 32×1 CRAM 1508 within top-half portion 1500 provides data to the read data register 302 within top-half portion 1550 synchronous to clock signal 1506 and receives data from write data register 304 from top-half portion 1500 synchronous with the clock signal 1506.

Moreover, another clock signal (not shown), such as clock signal 1506, is provided to read and write data registers 302 and 304 within bottom-half portion 310 (FIG. 3) in a similar manner as that provided to top-half portion 1500. The clock signal, such as clock signal 1506, provided to bottom-half portion 310 (FIG. 3) is not dependent on clock signal 1506 provided to top-half portion 1500. For example, clock signal 1506 provided to top-half portion 1500 is asynchronous with the clock signal provided to bottom-half portion 310 (FIG. 3). 32×1 CRAM 1508 within bottom-half portion 310 (FIG. 3) provides data to the read data register 302 within bottom-half portion 310 synchronous to the clock signal provided to the bottom-half portion 310 and receives data from write data register 304 from bottom-half portion 310 (FIG. 3) synchronous with the clock signal provided to bottom-half portion 310.

In a 64×10 mode, where N is equal to six and M is equal to ten, of a Stratix™ architecture of PLD 100 (FIG. 1) manufactured by Altera™ Corporation, ten write data registers, such as write data registers 424 (FIG. 4) or write data registers 908 (FIG. 9) of LAB 104 (FIG. 2) are used and the other ten registers of the LAB 104 are used as read data registers. In a 32×10 mode, where N is equal to five and M is equal to 10, of the Stratix™ architecture of LAB 104 (FIG. 2), all twenty registers of the LAB 104 are used as write data registers, and read data registers are built external to the LAB 104. In the time-borrowing flip-flop design illustrated in FIG. 3, there are forty registers available per LAB 104 (FIG. 2). In a 32×10 mode, where N is equal to six and M is equal to ten, twenty of the forty registers are used as read data registers. To minimize costs of implementing the twenty of the forty registers, a plurality of control signals, such as clear and load signals, are shared between registers 302 and 304 in top-half portion 308 (FIG. 3) and registers 302 and 304 in bottom-half portion 310 (FIG. 3).

In an alternative embodiment, clock signal 1506 is provided to respective clock inputs of write data register 302 and read data register 304 without passing the clock signal via multiplexers 1504.

Figure 16:
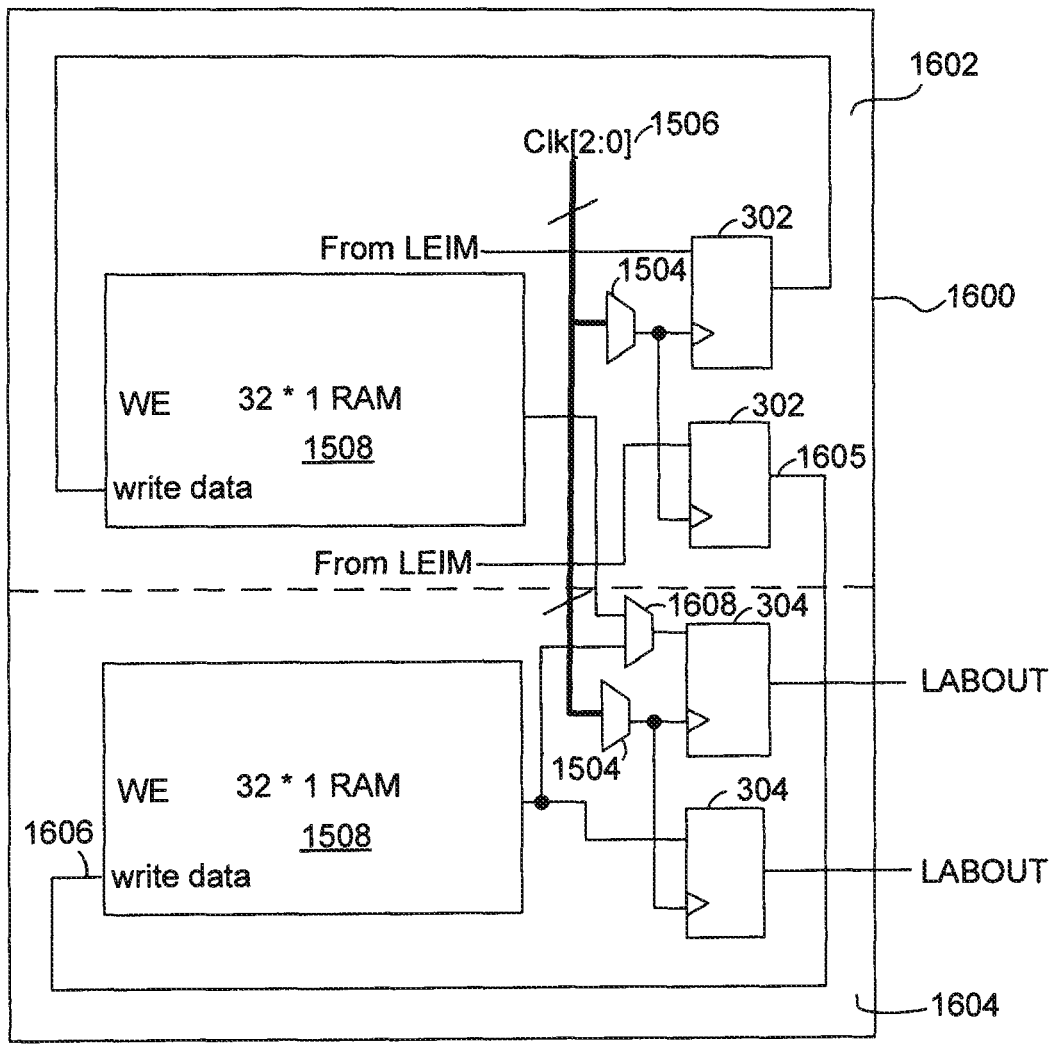
FIG. 16 is a block diagram of another embodiment of an ALM.

FIG. 16 is a block diagram of an embodiment of an ALM 1600, which is an example of any of ALMs 402 (FIG. 4) or any of ALMs 914 (FIG. 9). ALM 1600 includes a top-half portion 1602 and a bottom-half portion 1604. Top-half portion 1602 includes 32×1 CRAM 1508 (FIG. 15), write data register 302, and another write data register 302. It is noted that N is equal to five and M is equal to one in case of 32×1 CRAM 1508. Bottom-half portion 1604 includes 32×1 CRAM 1508, read data register 304, another read data register 304, and a multiplexer 1608. Multiplexer 1608 connects a data output of 32×1 CRAM 1508 within top-half portion 1602 or a data output of 32×1 CRAM 1508 within bottom-half portion 1508 with a data input of read data register 304 within bottom-half portion 1604. Each of write data register 424 (FIG. 4) and write data register 908 (FIG. 9) is an example of write data register 302.

Each read data register 304 is implemented either in hard logic or soft logic. ALM 1600 is an example of ALM 300 (FIG. 3). Clock signal 1506, which is clock signal 428 (FIG. 8) or delayed clock signal 430 (FIG. 11), is provided to all registers 302 and 304 of ALM 1600 via multiplexers 1504.

Moreover, a data output 1605 of write data register 302 of top-half portion 1602 is connected to a write data input 1606 of 32×1 CRAM 1508 of bottom-half portion 1604. No separate clock signals are used for top-half and bottom-half portions 1602 and 1604.

In an alternative embodiment, clock signal 1506 is provided to all registers 302 and 304 directly without passing via multiplexers 1504. In another alternative embodiment, data output 1605 of write data register 302 of top-half portion 1602 is connected to write data input of 32×1 CRAM 1508 of bottom-half portion 1604 via a multiplexer (not shown). It is further noted that although 32×1 CRAM 1508 blocks are shown in FIG. 16, in an alternative embodiment, 16×1 CRAM blocks or 8×1 CRAM blocks are used instead.

Figure 17:
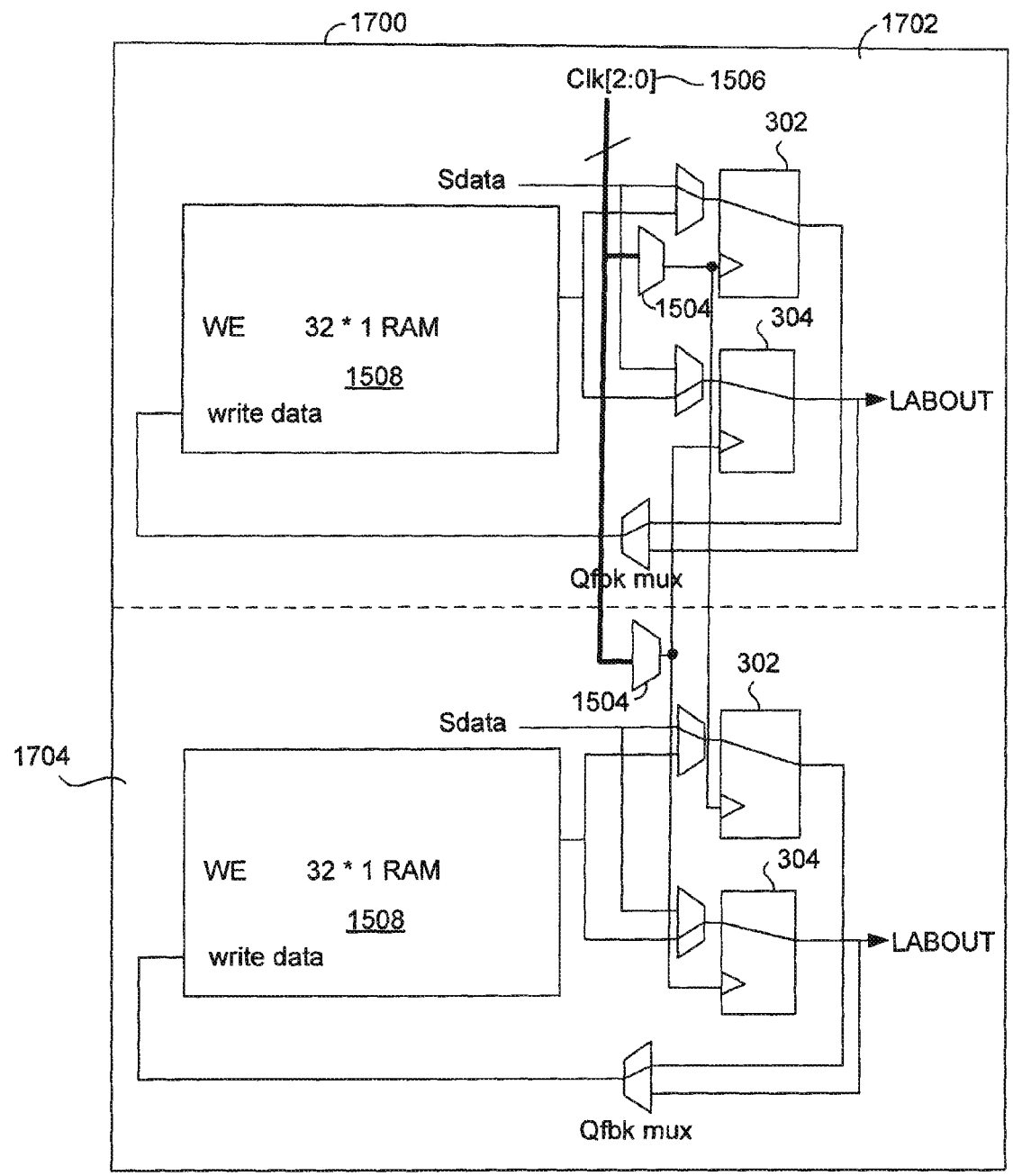
FIG. 17 is a block diagram of yet another embodiment of an ALM.

FIG. 17 is a block diagram of an embodiment of an ALM 1700, which is an example of any of ALMs 402 (FIG. 4) or any of ALMs 914 (FIG. 9). ALM 1700 includes a top-half portion 1702 and a bottom-half portion 1704. Top-half portion 1702 includes 32×1 CRAM 1508 (FIG. 15), write data register 302, and read data register 304. Bottom-half portion 1704 includes 32×1 CRAM 1508, write data register 302, and read data register 304.

Clock signal 1506 is provided to all registers 302 and 304 of ALM 1700 via multiplexers 1504. Multiplexer 1504 is located in top-half portion 1702 and another multiplexer 1504 is located in bottom-half portion 1704. Register 302 in bottom-half portion 1704 receives clock signal 1506 from top-half portion 1702 via multiplexer 1504 in top-half portion 1702 and register 304 in top-half portion 1702 receives clock signal 1506 from bottom-half portion 1704 via multiplexer 1504 in bottom-half portion 1704. ALM 1700 does not include multiplexer 1608 (FIG. 16) and input and output connections of the multiplexer 1608.

Figure 18:
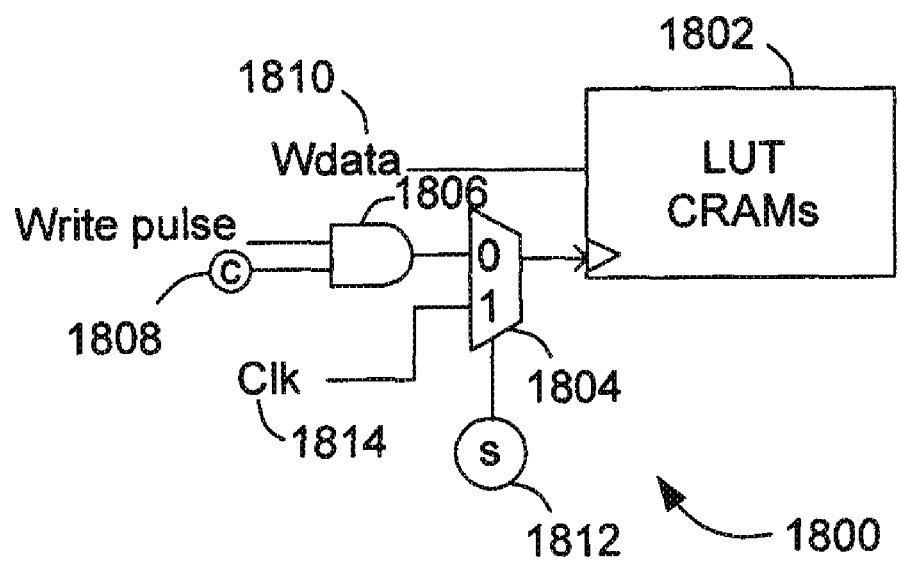
FIG. 18 is a block diagram of an embodiment of a system for preventing a write to a set of look-up table configurable random access memories (LUT CRAMs) of an ALM.

FIG. 18 is a block diagram of an embodiment of a system 1800 for preventing a write to a set 1802 of LUT CRAMs of an ALM. System 1800 includes a multiplexer 1804, an AND gate 1806, and a configuration cell 1808 storing a configuration bit. Set 1802 is included within a portion, such as top-half portion 308 (FIG. 3) and/or bottom-half portion 310 (FIG. 3), of ALM 402 (FIG. 4) or ALM 914 (FIG. 9). Set 1802 receives a write data signal 1810, which is an example of write data signal 416 (FIG. 8) or write data signal 916 (FIG. 11).

Set 1802 further receives an output signal of AND gate 1806 at a clock input of set 1802 instead of receiving delayed clock signal 430 (FIG. 8) or clock signal 428 (FIG. 11). Assertion of write pulse 802 (FIGS. 8 and 11) enables a write of write data signal 1810 to memory cell 202 (FIG. 2) of set 1802 and deassertion of the write pulse 802 disables the write. The processor determines whether set 1802 is used for RAM logic, such as a CRAM to store data, or for non-RAM logic, such as an N-input LUT that provides an output based on its N select inputs. For example, the processor determines whether out of M ALMs, such as 10 ALMs of LAB 104 (FIG. 2), (M-P) ALMs, such as 2 ALMs, are to be used to implement a CRAM and the remaining ALMs, such as P ALMs, are unavailable for implementing non-RAM logic, where P is an integer less than integer M. In such a case, it may be possible to use registers of the P ALMs for implementing non-RAM logic. However, in this case, LUTS of the P ALMs cannot be used for implementing non-RAM logic because data may be written to random addresses of memory cells 202 of the P ALMs.

Upon determining that set 1802 is used for non-RAM logic, the processor controls a select bit S within a configuration cell 1812 of PLD 100 (FIG. 1) to select a top input 0 of multiplexer 1804 to prevent a write to memory cell 202 (FIG. 2) of set 1802 independent of a state, such as assertion or deassertion, of write pulse 802. For example, upon determining, by the processor, that P ALMs are used for non-RAM logic, the processor controls configuration bit and select bit S to prevent a write to memory cell 202 of set 1802 of the P ALMs. On the other hand, upon determining, by the processor, to use set 1802 as a CRAM, the processor controls select bit S to select a bottom input 1 of multiplexer 1804 and upon selecting the bottom input, a clock signal 1814, such as clock signal 428 (FIG. 11) or delayed clock signal 430 (FIG. 8), is provided to the clock input of set 1802.

In another embodiment, the processor does not determine whether LEIM 208 (FIG. 2) of each ALM is reserved. Rather, one or two ALMs are always reserved to receive write address signal 412 (FIGS. 4 and 8) or write address signal 910 (FIGS. 9 and 11) and to receive byte-enable signal 418 (FIG. 4) or byte-enable signal 918 (FIG. 9). In such a case, the remaining non-reserved ALMs can be used for implementing RAM logic or non-RAM logic. In such a case, system 1800 (FIG. 18) is used to allow the non-reserved ALMs to be used efficiently without wasting resources of LAB 104 (FIG. 2).

In an alternative embodiment, instead of inputting and outputting a write address signal vial LEIM 208 (FIG. 2), the write address signal is input and output via secondary signal generation unit 212 (FIG. 2).

Figure 19:
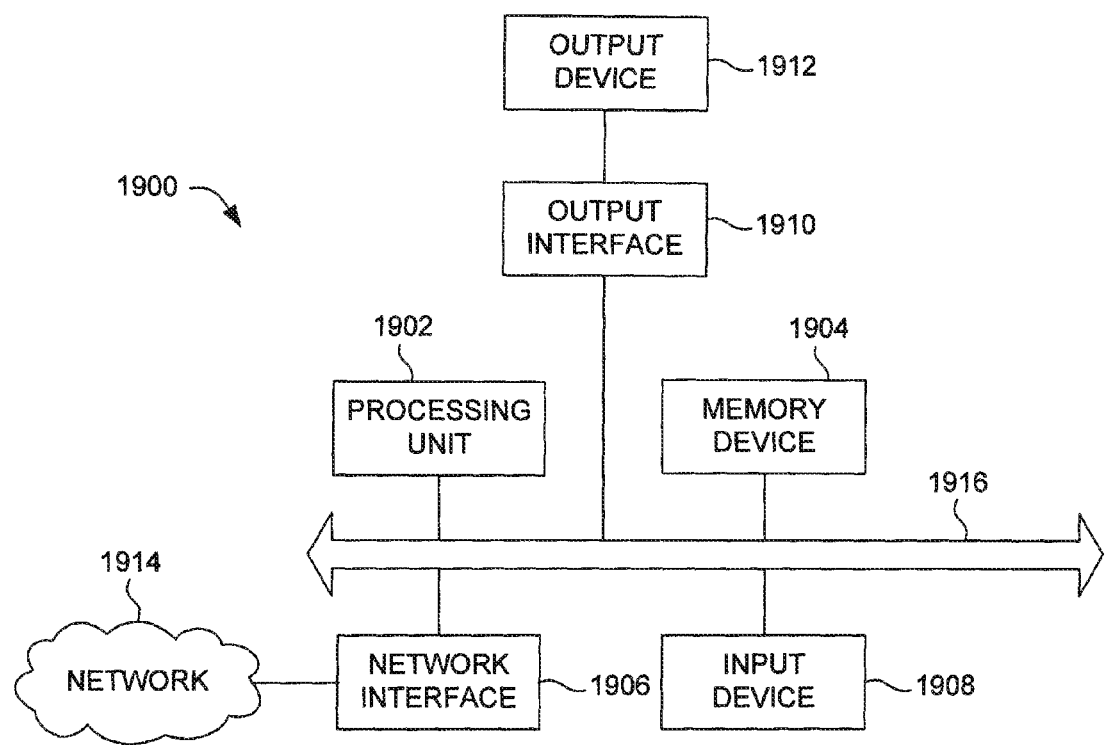
FIG. 19 is a block diagram of a system that is used to generate a design of the PLD of FIG. 1.

FIG. 19 is a block diagram of a system 1900 that is used to generate a design of PLD 100 (FIG. 1), of LAB 104 (FIG. 2), of LAB 400 (FIG. 4), of LAB 900 (FIG. 9), of system 1200 (FIG. 12), of system 1300 (FIG. 13), of ALM 1502 (FIG. 15), of ALM 1600 (FIG. 16), and/or of system 1700 (FIG. 17), described herein.

System 1900 includes a processing unit 1902, a memory device 1904, a network interface 1906, an input device 1908, an output interface 1910, and an output device 1912. Processing unit 1902 may be a central processing unit (CPU), the processor, a microprocessor, a hardware controller, a microcontroller, a programmable logic device programmed for use as a controller, a network controller, or other processing unit. Memory device 1904 may be a RAM, a read-only memory (ROM), or a combination of RAM and ROM. For example, memory device 1904 includes a computer-readable medium, such as a floppy disk, a ZIP™ disk, a magnetic disk, a hard disk, a compact disc-ROM (CD-ROM), a recordable CD, a digital video disc (DVD), or a flash memory. Memory device 1904 stores the techniques, including the program code, described herein, for managing a write to memory cell 202 (FIG. 2).

Network interface 1906 may be a modem or a network interface card (NIC) that allows processing unit 1902 to communicate with a network 1914, such as a wide area network (WAN) or a local area network (LAN). Processing unit 1902 may be connected via a wireless connection or a wired connection to network 1914. Examples of the wireless connection include a connection using Wi-Fi protocol or a WiMax protocol. The Wi-Fi protocol may be an IEEE 802.11, IEEE 802.11a, IEEE 802.11b, IEEE 802.11g, or IEEE 802.11i protocol. Examples of input device 1808 include a mouse, a keyboard, a stylus, or a keypad. Output device 1912 may be a liquid crystal display (LCD) device, a plasma display device, a light emitting diode (LED) display device, or a cathode ray tube (CRT) display device. Examples of output interface 1910 include a video controller that drives output device 1912 to display one or more images based on instructions received from processing unit 1902. Processing unit 1902 accesses the methods, described herein, for managing a write to memory cell 202 (FIG. 2), from memory device 1904 or from a remote memory device (not shown), similar to memory device 1904, via network 1914, and executes the methods. Processing unit 1902, memory device 1904, network interface 1906, input device 1808, output interface 1910, and output device 1912 communicate with each other via a bus 1916. In an alternative embodiment, system 1900 may not include network interface 1906.

Figure 20:
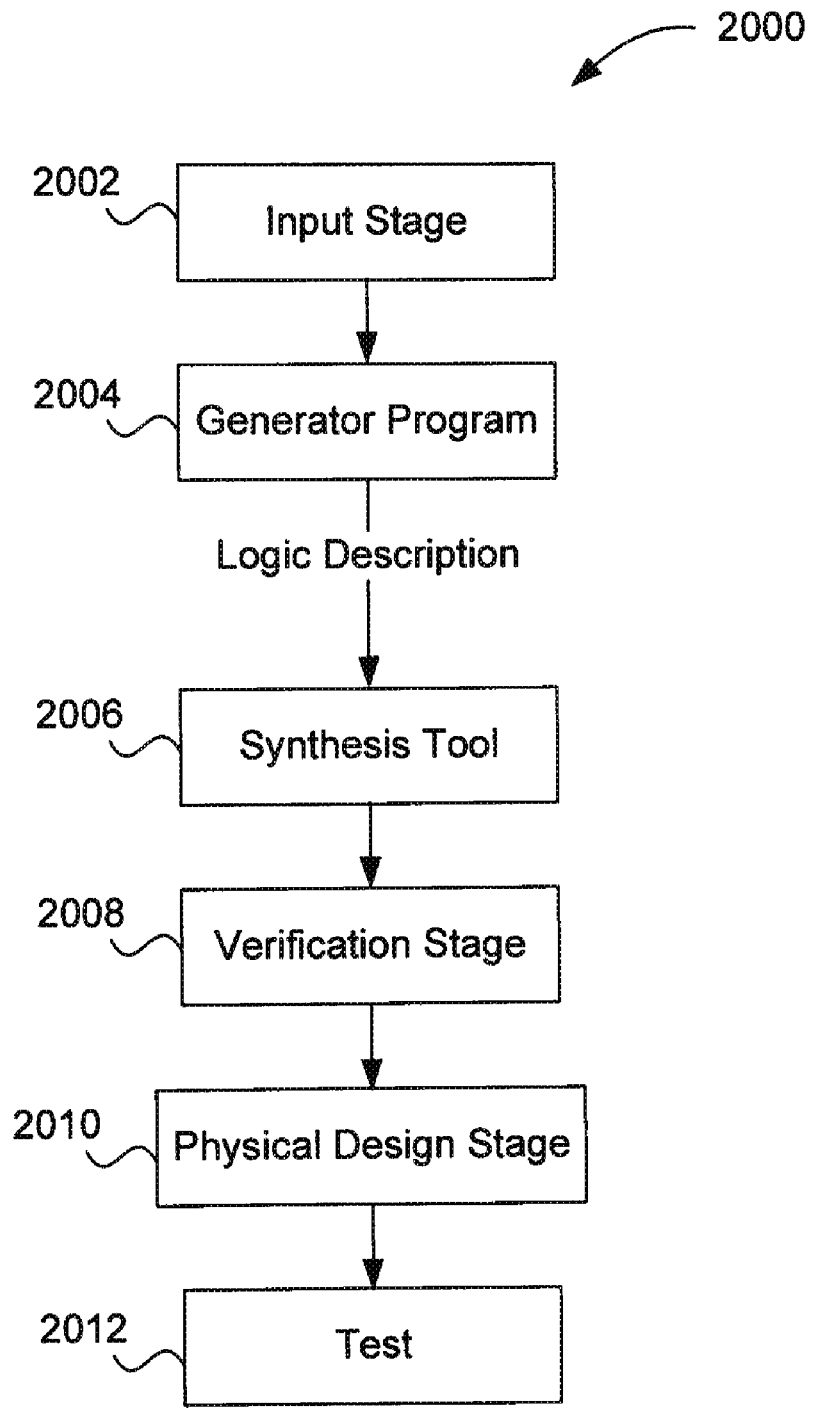
FIG. 20 is a diagrammatic representation showing a technique of a System On A Programmable Chip (SOPC) Builder executed using the system of FIG. 19 to design the PLD of FIG. 1.

FIG. 20 is a diagrammatic representation showing a technique 2000 executed using system 1900 (FIG. 19) to design PLD 100 (FIG. 1). An input stage 2002 receives selection information typically from the user for logic, such as, a processor core as well as other components such as a streaming output device to be implemented on PLD 100 (FIG. 1). In one example, an input received is in the form of a high-level language program.

In one example, input stage 2002 often allows selection and parameterization of components to be used on PLD 100 (FIG. 1). Input stage 2002 also allows configuration of variable or fixed latency support. In some examples, components provided to an input stage 2002 include intellectual property functions, megafunctions, and intellectual property cores. Input stage 2002 may be a graphical user interface (GUI) using wizards for allowing efficient or convenient entry of information. Input stage 2002 may also be a text interface or a program reading a data file such as a spreadsheet, database table, or schematic to acquire selection information. Input stage 2002 produces an output containing information about the various modules selected.

A generator program 2004 creates a logic description from information received via input stage 2002 and provides the logic description along with other customized logic to any of a synthesis tool 2006, place and route programs, and logic configuration tools to allow a logic description to be implemented on PLD 100 (FIG. 1).

In typical implementations, generator program 2004 can identify the selections and generate a logic description with information for implementing the various modules. Generator program 2004 can be a Perl script creating Hardware Description Language (HDL) files, such as, Verilog™, Abel™, Very High Speed Integrated Circuit HDL (VHDL), and Altera™ HDL (AHDL) files, from the module information entered by the user.

Generator program 2004 also provides information to synthesis tool 2006 to allow HDL files to be automatically synthesized. In some examples, a logic description is provided directly by the user. Hookups between various components selected by the user are also interconnected by generator program 2004. Some of the available synthesis tools are Leonardo Spectrum™, available from Mentor Graphics™ Corporation of Wilsonville, Oreg. and Synplify™ available from Synplicity™ Corporation of Sunnyvale, Calif. The HDL files may contain technology specific code readable by synthesis tool 2006.

Input stage 2002, generator program 2004, and synthesis tool 2006 can be separate programs. The interface between the separate programs can be a database file, a log, or simply messages transmitted between the programs. For example, instead of writing a file to storage, such as memory device 1904 (FIG. 19), input stage 2002 can send messages directly to generator program 2004 to allow the generator program 2004 to create a logic description. Similarly, generator program 2004 can provide information directly to synthesis tool 2006 instead of writing HDL files. Similarly, input stage 2002, generator program 2004, and synthesis tool 2006 can be integrated into a single program.

The user may select various modules and an integrated program can then take the user selections and output a logic description in the form of a synthesized netlist without intermediate files. According to other embodiments, a logic description is a synthesized netlist such as an Electronic Design Interchange Format Input File (EDF file). An EDF file is one example of a synthesized netlist file that can be output by synthesis tool 2006.

Synthesis tool 2006 can take HDL files and output EDF files. Synthesis tool 2006 allows the implementation of the logic design on PLD 100 (FIG. 1).

A verification stage 2008 typically follows an application of synthesis tool 2006. Verification stage 2008 checks the accuracy of the logic deign of PLD 100 (FIG. 1) to ensure that an intermediate or final design realizes the expected requirements. Verification stage 2008 typically includes simulation tools, functional verification tools, and timing analysis tools for timing verification. Tools for simulation allow the application of inputs and the observation of outputs without having to implement PLD 100 (FIG. 1). Simulation tools provide the user with cost effective and efficient mechanisms for both functional and timing verification of a design of PLD 100 (FIG. 1). Functional verification involves the circuit's logical operation independent of timing considerations. Parameters such as gate delays are disregarded.

Timing verification involves the analysis of the design's operation with timing delays. Setup, hold, and other timing requirements for sequential devices, such as, flip-flops, within a design of PLD 100, are confirmed. Some available simulation tools include Synopsys VCS™, VSS, and Scirocco™, available from Synopsys™ Corporation of Sunnyvale, Calif. and Cadence NC-Verilog™ and NC-VHDL™ available from Cadence Design Systems™ of San Jose, Calif.

After verification stage 2008, the synthesized netlist file can be provided to a physical design stage 2010 including the place and route phase and configuration tools. The place and route phase typically locates logic cells on specific logic elements of PLD 100 (FIG. 1) and connects wires between the inputs and outputs of various logic elements of the PLD 100 in accordance with logic required to implement an electronic design. PLD 100 (FIG. 1) can also be physically tested at 2012.

For programmable logic devices, a programmable logic configuration stage can take the output of the place and route phase to program PLD 100 (FIG. 1) with the user selected and parameterized modules. According to various embodiments, the place and route phase and the logic configuration stage are provided in a Quartus™ Development Tool, available from Altera™ Corporation.

As noted above, different stages and programs can be integrated in a variety of manners. According to one embodiment, input stage 2002, generator program 2004, synthesis tool 2006, verification stage 2008, and physical design stage 2010 are integrated into a single program, such as an SOPC Builder. The various stages are automatically run using system 1900 (FIG. 19) and transparent to the user. The program code can receive the user selected modules, generate a logic description depicting logic for implementing the various selected modules, and implement PLD 100 (FIG. 1). As will be appreciated by one of skill in the art, HDL files and EDF files are mere examples of a logic description. Other file formats as well as internal program representations are other examples of a logic description.

It is noted that the terms top-half and bottom-half, used herein, are relative terms. For example, as shown in FIG. 16, top-half portion 1602 is above bottom-half portion 1604. In an alternative embodiment, top-half portion 1602 is located below bottom-half portion 1604. Moreover, it is noted that the above-described systems and methods are described with reference to PLD 100 (FIG. 1). However, the above-described systems and methods can be applied to other integrated circuits, such as an ASIC.

Technical effects of the herein described systems and methods for managing a write to memory cell 202 (FIG. 2) of PLD 100 includes avoiding building, in soft logic, a write address register external to LAB 104 (FIG. 2). If a write address register is built in soft logic, processing unit 1902 (FIG. 19) places and routes the write address register in computer-aided design (CAD) and due to such place and route, a timing relationship between an assertion of a write address signal and a write to a memory cell is dependent on design of a PLD. Consequently, it is difficult to start a write some fixed time after the assertion of a write address signal.

A solution to the design dependency is to perform a write on a falling edge of a clock signal, one-half cycle after an assertion of a write address signal. However, this solution creates a half-cycle constraint, which can be measured and optimized in CAD with static timing analysis. However, the half-cycle constraint makes it difficult to meet timing, especially in the context of a large design of a PLD, with duty cycle and clock skew, which further reduce available timing margin.

Moreover, in case of a write address register implemented in soft logic, it is difficult to guarantee stable behavior of a PLD when reading from and writing to the same address on the same clock cycle. One option is to guarantee that data written to a memory cell is always read before the data is overwritten. Because a write begins at the one-half cycle in the solution provided above, the write must complete and data written to a memory cell must be read out and latched by a read data register in the remaining half-clock cycle. For a high speed design, it may be difficult to meet the half-cycle constraint.

Another option is to guarantee that data written to a memory cell is read before new data is written to the memory cell. This guarantee can be achieved by adding negative edge-triggered registers at a data output of a CRAM to latch old data before a write begins within the CRAM. Aside from a soft logic cost of the negative edge-triggered register, the negative edge-triggered register adds two new half-cycle paths including a first path from a read address register, through a LUT to one of the negative edge-triggered registers and a second path from the negative edge-triggered register to a read data register. Because the first path goes through a LUT, it may be difficult to meet timing for a high-speed design of a PLD.

Yet another option is to accept undefined read data in a case in which a memory address is written to and read from during the same clock cycle. This option may be acceptable for some applications, such as first-in-first-out (FIFO), however, some other application require a stable read-during-write behavior for writing to and reading from the same address of a memory cell during the same clock cycle.

PLD 100 (FIG. 1) maintains an efficient use of all $2^N \times M$ bits per LAB 104 (FIG. 1) without the use of the half-cycle constraint. By implementing write address registers 420 (FIG. 4) within LAB 400 (FIG. 4), all timing paths of the LAB 400 have a full cycle of delayed clock signal 430 (FIG. 8) to write to and read from memory cell 202 (FIG. 2). Similarly, by implementing write address registers 904 (FIG. 9) in LAB 900 (FIG. 9), all timing paths of the LAB 900 have a full cycle of clock signal 428 (FIG. 11) to write to and read from memory cell 202 (FIG. 2).

Because write address signal 412 (FIG. 4) and write address signal 910 (FIG. 11) are routed on dedicated hard-wired paths and respective dedicated write address registers 420 and 904 (FIGS. 4 and 9) implemented in hard logic, it is easy to meet timing when PLD 100 is designed, rather than having to meet the half-cycle constraint in CAD using different placement and routing resources for every MLAB. Also, for read-during-write behavior, there is a full cycle, of delayed clock signal 430 (FIG. 8) or clock signal 428 (FIG. 11) available to complete a write of data to memory cell 202 (FIG. 2) and read of the data from the memory cell 202. This full cycle excludes a small amount of delay from assertion of delayed clock signal 430 (FIG. 8) to assertion of write pulse 802 (FIG. 8) and from assertion of clock signal 428 (FIG. 11) to assertion of write pulse 802 (FIG. 11).

Although the foregoing systems and techniques have been described in detail by way of illustration and example for purposes of clarity and understanding, it will be recognized that the above described systems and techniques may be embodied in numerous other specific variations and embodiments without departing from the spirit or essential characteristics of the systems and techniques. Certain changes and modifications may be practiced, and it is understood that the systems and techniques are not to be limited by the foregoing details, but rather is to be defined by the scope of the appended claims.

What is claimed is:

1. An integrated circuit comprising:
a logic element (LE) including an N-input look-up table (LUT) having a configurable random access memory (CRAM), wherein N is an integer;
a write address decoder coupled to the LE;
a dedicated write address hard logic storage element configured to store an address of a memory cell in the CRAM;
a delay circuit configured to delay a clock signal to generate a delayed clock signal, wherein the delay is sufficient to provide time for an address output by the dedicated write address hard logic storage element to propagate through the write address decoder; and
a cell configured to assert a write pulse when the cell receives the delayed clock signal.

2. An integrated circuit in accordance with claim 1, wherein the integrated circuit includes an application specific integrated circuit or a field programmable gate array.

3. An integrated circuit in accordance with claim 1, wherein a write operation is performed in response to the write pulse, and wherein the write operation occurs before a falling edge of the clock signal if the delayed clock signal is generated based on the rising edge of the clock signal, and wherein the write operation occurs before a rising edge of the clock signal if the delayed clock signal is generated based on the falling edge of the clock signal.

4. An integrated circuit in accordance with claim 1, wherein the LE is an adaptive logic module (ALM).

5. An integrated circuit in accordance with claim 1, wherein the dedicated write address hard logic storage element is implemented as an edge-triggered flip-flop.

6. An integrated circuit in accordance with claim 1, further comprising:
a logic array block (LAB) including the LE; and
a gate configured to gate a clock signal with a LAB-wide write pulse to generate an output clock, wherein the LAB-wide write pulse enables a write to the LE of the LAB.

7. An integrated circuit in accordance with claim 1, further comprising a processor configured to determine whether the CRAM is to be used to implement non-RAM logic, wherein the processor is configured to control a configuration bit to prevent a write to the CRAM upon determining that the CRAM is to be used for implementing the non-RAM logic.

8. An integrated circuit comprising:
a logic element (LE) including an N-input look-up table (LUT) having a configurable random access memory (CRAM), wherein N is an integer;
a write address decoder coupled to the LE; and
a dedicated write address hard logic storage element configured to store an address of a memory cell in the CRAM, wherein the write address storage element is implemented as a level-sensitive latch, wherein the write address decoder is configured to provide an undelayed clock signal to a cell, wherein the cell is configured to assert a write pulse when the cell receives the undelayed clock signal.

9. An integrated circuit in accordance with claim 8 further comprising:
a logic array block (LAB) including the LE; and
a gate configured to gate a clock signal with a LAB-wide write pulse to generate an output clock, wherein the LAB-wide write pulse enables a write to the LE of the LAB.

10. An integrated circuit in accordance with claim 8, wherein the integrated circuit includes an application specific integrated circuit or a field programmable gate array.

11. An integrated circuit in accordance with claim 8 further comprising a processor configured to determine whether the CRAM is to be used to implement non-Random Access Memory (RAM) logic, wherein the processor is configured to control a configuration bit to prevent a write to the CRAM upon determining that the CRAM is to be used for implementing the non-RAM logic.

12. An integrated circuit comprising:
a plurality of logic array blocks (LABs);
a plurality of LAB lines configured to facilitate communication between the plurality of LABs;
a plurality of local lines configured to communicate a plurality of signals within one LAB of the plurality of LABs;
a signal generation unit configured to provide a plurality of secondary signals to one LAB of the plurality of LABs, wherein the one LAB of the plurality of LABs includes a logic element (LE) having an N-input look-up table (LUT) having a configurable random access memory (CRAM), where N is an integer;
a write address decoder coupled to the LE; and
a dedicated write address hard logic storage element configured to store an address of a memory cell in the CRAM
a delay circuit configured to delay a clock signal to generate a delayed clock signal, wherein the delay is sufficient to provide time for an address output by the dedicated write address hard logic storage element to propagate through the write address decoder; and
a cell configured to assert a write pulse when the cell receives the delayed clock signal.

13. An integrated circuit in accordance with claim 12, wherein the integrated circuit includes an application specific integrated circuit or a field programmable gate array.

14. An integrated circuit in accordance with claim 12, wherein a write operation is performed in response to the write pulse, and wherein the write operation occurs before a falling edge of the clock signal if the delayed clock signal is generated based on the rising edge of the clock signal, and wherein the write operation occurs before a rising edge of the clock signal if the delayed clock signal is generated based on the falling edge of the clock signal.

15. An integrated circuit in accordance with claim 12, wherein the dedicated write address hard logic storage element is implemented as an edge-triggered flip-flop.

16. An integrated circuit in accordance with claim 12, further comprising:
a logic array block (LAB) including the LE; and
a gate configured to gate a clock signal with a LAB-wide write pulse to generate an output clock signal, wherein the LAB-wide write pulse enables a write to the LE of the LAB.

17. An integrated circuit comprising:
a plurality of logic array blocks (LABs);
a plurality of LAB lines configured to facilitate communication between the plurality of LABs;
a plurality of local lines configured to communicate a plurality of signals within one LAB of the plurality of LABs;
a signal generation unit configured to provide a plurality of secondary signals to one LAB of the plurality of LABs, wherein the one LAB of the plurality of LABs includes a logic element (LE) having an N-input look-up table (LUT) having a configurable random access memory (CRAM), where N is an integer;
a write address decoder coupled to the LE; and
a dedicated write address hard logic storage element configured to store an address of a memory cell in the CRAM,
wherein the write address storage element is implemented as a level-sensitive latch, wherein the write address decoder is configured to provide an undelayed clock signal to a cell, the cell configured to assert a write pulse when the cell receives the undelayed clock signal.

18. An integrated circuit in accordance with claim 11 further comprising:
a logic array block (LAB) including the LE; and
a gate configured to gate a clock signal with a LAB-wide write pulse to generate an output clock, wherein the LAB-wide write pulse enables a write to the LE of the LAB.

19. An integrated circuit in accordance with claim 11, wherein the integrated circuit includes an application specific integrated circuit or a field programmable gate array.

20. A method for managing a write operation, the method comprising:
storing, within a write address hard logic storage element, an address of a memory cell of a configurable random access memory (CRAM), wherein a logic element (LE) is coupled to a write address decoder, wherein the LE includes an N-input look-up table (LUT) including the CRAM, wherein N is an integer; and generating, using a delay circuit, a delayed clock signal from an original clock signal, the delayed clock signal sent to a cell, the cell configured to assert a write pulse when the cell receives the delayed clock signal, wherein the delayed clock signal provides sufficient delay to allow time for an address output by the dedicated write address hard logic storage element to propagate through the write address decoder.

21. A method in accordance with claim 20, wherein the integrated circuit includes an application specific integrated circuit or a field programmable gate array.

22. A method for managing a write operation, the method comprising:
storing, within a write address hard logic storage element, an address of a memory cell of a configurable random access memory (CRAM), wherein a logic element (LE) is coupled to a write address decoder, wherein the LE includes an N-input look-up table (LUT) including the CRAM, wherein N is an integer; and
wherein the write address hard logic storage element is implemented as a level-sensitive latch, wherein the write address decoder is configured to provide an undelayed clock signal to a cell, the cell configured to assert a write pulse when the cell receives the undelayed clock signal.

23. A method in accordance with claim 22, wherein the integrated circuit includes an application specific integrated circuit or a field programmable gate array.

24. An integrated circuit comprising:
a logic element (LE) including an N-input look-up table (LUT) having a configurable random access memory (CRAM), wherein N is an integer;
a write address decoder coupled to the LE;
a dedicated write address hard logic storage element register configured to store an address of a memory cell of the CRAM;
a logic array block (LAB) including the LE; and
a gate configured to gate a clock signal with a LAB-wide write pulse to generate an output clock, wherein the LAB-wide write pulse enables a write to the LE of the LAB.

25. An integrated circuit comprising:
a logic element (LE) including an N-input look-up table (LUT) having a configurable random access memory (CRAM), wherein N is an integer;
a write address decoder coupled to the LE; and
a dedicated write address hard logic storage element register configured to store an address of a memory cell of the CRAM,
wherein the LE includes a first $2^N \times 1$ CRAM and a second $2^N \times 1$ CRAM, a first read data register, a second read data register, a first write data register, and a second write data register, wherein the first $2^N \times 1$ CRAM is configured to provide data to the first read data register synchronous to a first clock signal and is configured to receive data from the first write data register synchronous with the first clock signal, wherein the second $2^N \times 1$ CRAM is configured to send data to the second read data register synchronous with a second clock signal and the second $2^N \times 1$ CRAM is configured to receive data from the second write data register synchronous with the second clock signal.

26. An integrated circuit comprising:
a logic element (LE) including an N-input look-up table (LUT) having a configurable random access memory (CRAM), wherein N is an integer;
a write address decoder coupled to the LE; and
a dedicated write address hard logic storage element register configured to store an address of a memory cell of the CRAM,
wherein the LE includes a first-half portion and a second-half portion, wherein the first half-portion includes a first $2^N \times 1$ CRAM, a first read data register, and a first write data register, wherein the second half-portion includes a second $2^N \times 1$ CRAM, a second read data register, and a second write data register, wherein the second write data register is configured to receive a clock signal from the top-half portion and the first read data register is configured to receive a clock signal from the bottom-portion.

27. An integrated circuit comprising:
a logic element (LE) including an N-input look-up table (LUT) having a configurable random access memory (CRAM), wherein N is an integer;
a write address decoder coupled to the LE; and
a dedicated write address hard logic storage element register configured to store an address of a memory cell of the CRAM,
wherein the LE includes a first $2^N \times 1$ CRAM and a second $2^N \times 1$ CRAM, a first read data register, a second read data register, a first write data register, and a second write data register, wherein all the registers are clocked with a same clock signal, wherein the write data registers are in a first-half portion of the LE and the read data registers are in a second half-portion of the LE.

* * * * *